(12) United States Patent
Ishikawa et al.

(10) Patent No.: US 8,971,010 B2
(45) Date of Patent: Mar. 3, 2015

(54) ELECTROSTATIC CHUCK AND METHOD OF MANUFACTURING ELECTROSTATIC CHUCK

(75) Inventors: Kaduko Ishikawa, Fukuoka-ken (JP); Junji Yonezawa, Fukuoka-ken (JP); Toshihiro Aoshima, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 243 days.

(21) Appl. No.: 13/816,050

(22) PCT Filed: Aug. 11, 2011

(86) PCT No.: PCT/JP2011/068401
§ 371 (c)(1),
(2), (4) Date: Mar. 20, 2013

(87) PCT Pub. No.: WO2012/020832
PCT Pub. Date: Feb. 16, 2012

(65) Prior Publication Data
US 2013/0201598 A1     Aug. 8, 2013

(30) Foreign Application Priority Data

Aug. 11, 2010  (JP) ................................. 2010-180605
Aug. 4, 2011   (JP) ................................. 2011-171019

(51) Int. Cl.
*H01T 23/00*       (2006.01)
*H02N 13/00*       (2006.01)
*B23Q 3/152*       (2006.01)
*H01L 21/683*      (2006.01)

(52) U.S. Cl.
CPC ................ *H02N 13/00* (2013.01); *B23Q 3/152* (2013.01); *H01L 21/6833* (2013.01)
USPC ...................................................... 361/234

(58) Field of Classification Search
USPC ......................................................... 361/234
See application file for complete search history.

(56) References Cited

U.S. PATENT DOCUMENTS

| | | | | |
|---|---|---|---|---|
| 5,531,835 A | * | 7/1996 | Fodor et al. | 118/728 |
| 5,675,471 A | * | 10/1997 | Kotecki | 361/234 |
| 7,072,166 B2 | * | 7/2006 | Qin et al. | 361/234 |
| 7,663,860 B2 | * | 2/2010 | Nishimoto et al. | 361/234 |
| 7,672,110 B2 | * | 3/2010 | Sun et al. | 361/234 |
| 2003/0181310 A1 | | 9/2003 | Yamamoto et al. | |
| 2005/0207088 A1 | | 9/2005 | Nishimoto et al. | |
| 2009/0056112 A1 | | 3/2009 | Kobayashi | |
| 2009/0236542 A1 | | 9/2009 | Wallis | |

FOREIGN PATENT DOCUMENTS

| | | |
|---|---|---|
| JP | 2007-214288 A | 8/2007 |
| JP | 2007-255957 A | 10/2007 |
| JP | 2008-135736 A | 6/2008 |
| JP | 2008-177339 A | 7/2008 |

\* cited by examiner

*Primary Examiner* — Stephen W Jackson
(74) *Attorney, Agent, or Firm* — Carrier Blackman & Associates, P.C.; Joseph P. Carrier; Fulchand P. Shende

(57) ABSTRACT

An electrostatic chuck comprises: a dielectric substrate having a protrusion and a planar surface part. The protrusion is formed on a major surface of the dielectric substrate. An adsorption target material is mounted on the major surface. The planar surface part is formed in a periphery of the protrusion. The dielectric substrate is formed from a polycrystalline ceramics sintered body. A top face of the protrusion is a curved surface, and a first recess is formed in the top face to correspond to crystal grains that appear on the surface. The planar surface part has a flat part, and a second recess is formed in the flat part. A depth dimension of the first recess is greater than a depth dimension of the second recess. The electrostatic chuck can suppress the generation of particles and a method for manufacturing the electrostatic chuck is provided.

9 Claims, 21 Drawing Sheets

FIG. 13A
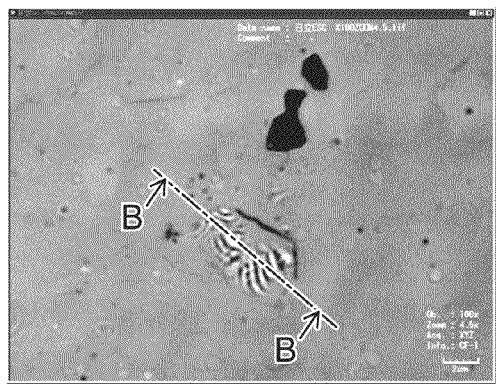
FIG. 13B    LASER MICROSCOPE INTERFERENCE FRINGE
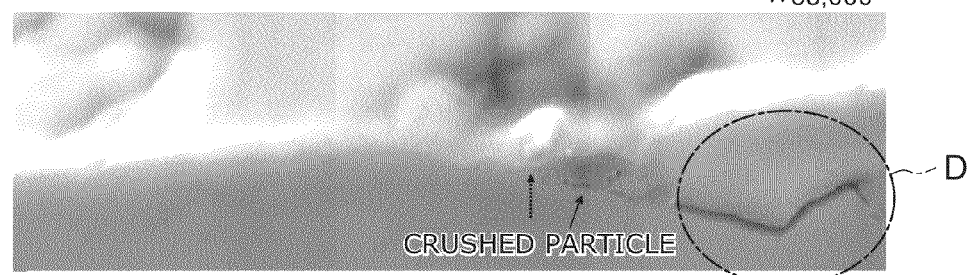
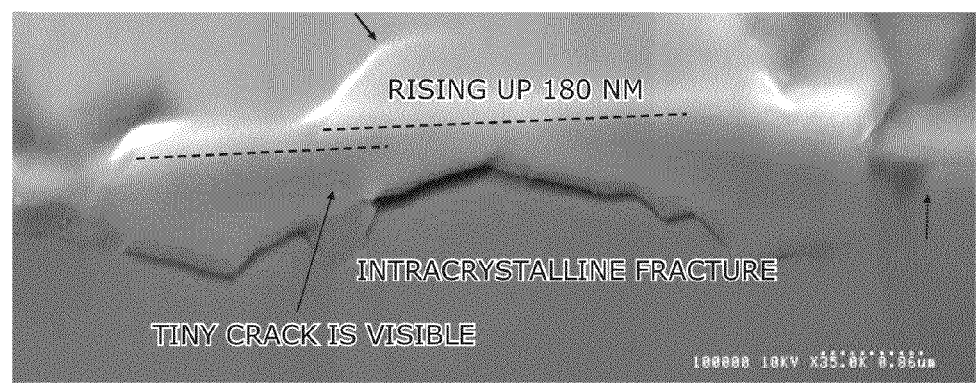
FIG. 13C
FIG. 13D
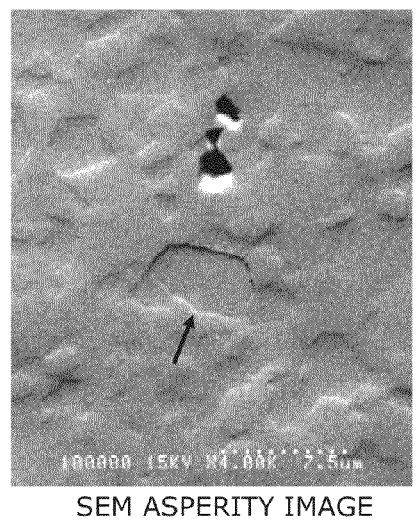
SEM ASPERITY IMAGE

E

POSITION ON THE DIELECTRIC SUBSTRATE

FIG. 28A

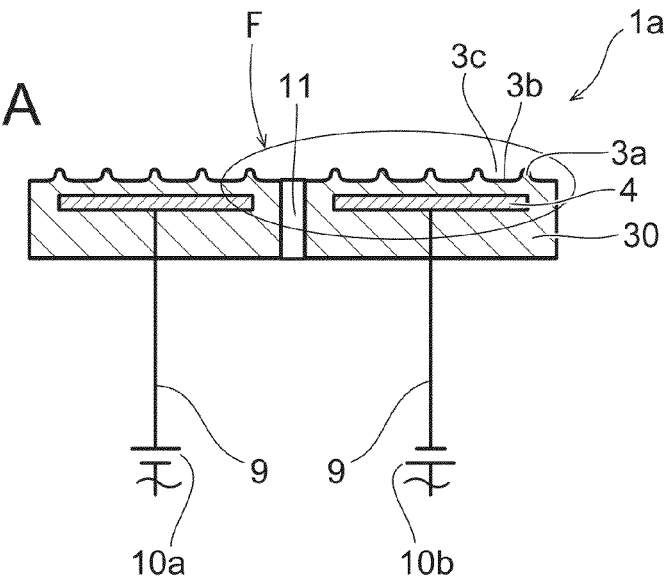

FIG. 28B

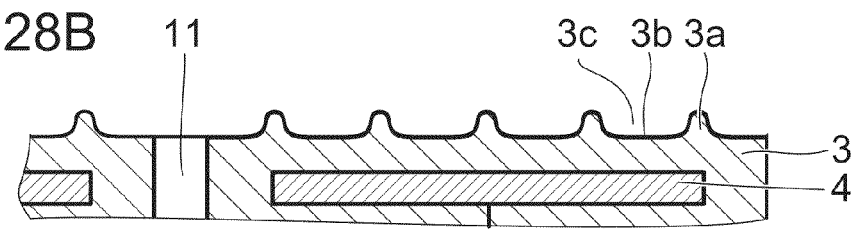

```
┌─────────────────────────────────────────────────────┐
│ The protrusion 3a, the flat part 3b2, the recess 13a, and │
│ the recess 13b are formed using the CMP method.     │
└─────────────────────────────────────────────────────┘
                         │
                         ▼
              ◇ The interference fringe
         space occupancy ratio found by using a laser  ──N──┐
              microscope is less than 1%.                    │
                         │                                   │
                         Y                                   │
                         ▼                                   │
┌─────────────────────────────────────────────────────┐     │
│ The process that uses the CMP method is completed.  │     │
└─────────────────────────────────────────────────────┘     │
```

FIG. 29

ELECTROSTATIC CHUCK AND METHOD OF MANUFACTURING ELECTROSTATIC CHUCK

TECHNICAL FIELD

An aspect of the invention generally relates to an electrostatic chuck and a method of manufacturing the electrostatic chuck.

BACKGROUND ART

Electrostatic chucks are used as means to adsorptively hold down an adsorption target material (such as a semiconductor wafer or a glass substrate) in substrate processing devices that perform etching, chemical vapor deposition (CVD), sputtering, ion implantation, ashing, exposure, inspection, and the like.

There is a risk here that particles will be generated if the adsorption target material rubs against the mounting face of the electrostatic chuck. Further, increasing the contact surface area between the mounting face of the electrostatic chuck and the adsorption target material may lead to poor adsorption/desorption responsiveness of the adsorption target material.

Therefore, techniques are known that improve adsorption/desorption responsiveness of the adsorption target material while suppressing particle contamination by reducing the size of the contact surface area by providing protrusions on the mounting face side of the electrostatic chuck.

Furthermore, in addition to providing protrusions on the mounting face side of the electrostatic chuck, a technique is proposed for buffing the top face of the protrusions to form a planar surface where the top face has a surface roughness of not more than 0.25S (see Patent Literature 1).

The technique disclosed in Patent Literature 1 mirror polishes the top face and side surface of the protrusions as well as the planar surface around the protrusions (bottom surface of the recess) such that the generation of particles can be suppressed even when the underside of the adsorption target material contacts these areas (see [0008], [0029], and [0035] of Patent Literature 1).

However, in the technology disclosed in Patent Literature 1, a protrusion is formed by using a sand blasting method. Therefore, a defective part such as a crack may be generated in a surface region of the protrusion or a surface region of a planar surface part.

When these types of defective parts exist in the surface region, a part of the surface region desorbs as a base point of the defective part with the risk of generating particles.

Particularly in recent years, there has been a trend in which the restriction on the number of particles attached to the underside and the like of the adsorption target material has become more strict. Therefore, there is a risk that restricting the number of particles cannot be accommodated as long as the defective part residing in the surface region cannot be reduced.

This type of defective part that resides in the surface region is not directly visible from the outside. In other words, conventionally, quantitative evaluation for defective parts was difficult.

The defective parts that reside in the surface region cannot be removed by buffing disclosed in Patent Document 1, and use of grinding processing methods, laser engraving methods, shot blasting methods, and the like have the risk of further increasing defective parts.

There is a risk of increasing particles if no consideration is given to the crystal grain diameter of the material that configures the top face or side face of the protrusion as well as the planar surface part in the periphery of the protrusion.

CITATION LIST

Patent Literature

[PLT 1]
 JP 2003-86664 A (Kokai)

SUMMARY OF INVENTION

Technical Problem

The aspect of the invention, based on recognition of such problems, provides an electrostatic chuck that can suppress the generation of particles and provides a method for manufacturing the electrostatic chuck.

Solution to Problem

The first invention is an electrostatic chuck that includes a dielectric substrate having a protrusion and a planar surface part. The protrusion is formed on a major surface of the dielectric substrate. An adsorption target material is mounted on the major surface and the planar surface part is formed in a periphery of the protrusion. The dielectric substrate is formed from a polycrystalline ceramics sintered body, and an interference fringe space occupancy ratio on a major surface found by using a laser microscope is less than 1%.

With this electrostatic chuck, the number of particles generated by desorption of a portion of the surface region can be greatly reduced because the interference fringe space occupancy ratio can be less than 1%.

The second invention, according to the first invention, is an electrostatic chuck in which the average grain diameter of crystal grains of the polycrystalline ceramics sintered body is less than the height dimension of the protrusion.

With this electrostatic chuck, the shedding of crystal grains from the dielectric substrate can be suppressed. The changing of the shape of the protrusion can be suppressed even if crystal grains are shed.

The third invention, according to the second invention, is an electrostatic chuck in which the average grain diameter is not more than 1.5 μm.

With this electrostatic chuck, the shedding of crystal grains from the dielectric substrate can be more securely suppressed. The changing of the shape of the protrusion can be suppressed even if crystal grains are shed.

The fourth invention, according to the second invention, is an electrostatic chuck in which a standard deviation of the grain diameter distribution of the crystal grains is not more than 1 μm.

With this electrostatic chuck, the shedding of crystal grains from the dielectric substrate can be more securely suppressed. The changing of the shape of the protrusion can be suppressed even if crystal grains are shed.

The fifth invention, according to the first invention, is an electrostatic chuck in which the dielectric substrate is formed from a polycrystalline alumina sintered body and has a bulk density of not less than 3.96.

With this electrostatic chuck, shedding of crystal grains from the dielectric substrate can be more securely suppressed because the polycrystalline alumina sintered body that is the base material can have a dense configuration.

The sixth invention, according to the first invention, is an electrostatic chuck in which the dielectric substrate is formed from a polycrystalline alumina sintered body and has an alumina content of not less than 99.9 wt %.

According to this electrostatic chuck, shedding of crystal grains from the dielectric substrate can be more securely suppressed because the polycrystalline alumina sintered body that is the base material can have a dense configuration.

Further, the seventh invention, according to the first invention, is an electrostatic chuck in which the dielectric substrate has a volume resistivity of not less than $10^8$ Ωcm and not more than $10^{13}$ Ωcm in an operating temperature range of the electrostatic chuck.

This type of electrostatic chuck adsorbs the adsorption target material using a Johnsen-Rahbeck force. Although using a Johnsen-Rahbeck force provides a stronger adsorptive force than when using a Coulomb force, the generation of particles can be greatly reduced even with this type of electrostatic chuck.

Further, the eight invention, according to the seventh invention, is an electrostatic chuck in which the dielectric substrate is formed from a polycrystalline alumina sintered body and has an alumina content of not less than 99.4 wt %.

If formed from this type of highly pure alumina, contamination by substances other than alumina can be suppressed.

Further, the ninth invention is a method of manufacturing of an electrostatic chuck that includes a dielectric substrate having a protrusion and a planar surface part. The protrusion is formed on a major surface of the dielectric substrate. An adsorption target material is mounted on the major surface and the planar surface part is formed in a periphery of the protrusion. The dielectric substrate is formed from a polycrystalline ceramics sintered body; and processing the major surface is continued until the interference fringe space occupancy ratio on the major surface found by using a laser microscope is less than 1%.

With this manufacturing method of an electrostatic chuck, the number of particles generated by a portion of the surface region desorbing can be greatly reduced because the interference fringe space occupancy ratio can be less than 1%.

Advantageous Effects of Invention

According to the aspect of the invention, an electrostatic chuck that can suppress the generation of particles, and a manufacturing method of the electrostatic chuck, can be provided.

BRIEF DESCRIPTION OF DRAWINGS

FIG. 6A is a three-dimensional image of the recess 13a, and FIGS. 6B and 6C are diagrams for illustrating the profile of the recess 13a.

FIG. 7A is a three-dimensional image of the recess 13b, and FIGS. 7B and 7C are diagrams for illustrating the profile of the recess 13b.

FIG. 13A is a laser microscope photograph for illustrating the interference fringe that occurs in the portion where a defect resides, and FIG. 13B is a scanning electron microscope (SEM) photograph of the cross-section on the B-B line in FIG. 13A. Further, FIG. 13C is a magnified photograph of the D part in FIG. 13B and FIG. 13D is a scanning electron microscope photograph of the same portion as FIG. 13A.

FIG. 24A is a graph for illustrating the profile of the measurement value and FIG. 24B is a laser microscope photograph for illustrating the measurement position.

FIG. 27B shows the case where the polycrystalline alumina sintered body serving as the base material is illustrated in FIG. 26B.

FIG. 28A is a schematic cross-sectional view for illustrating the electrostatic chuck, and FIG. 28B is a schematic magnified view of the F part in FIG. 28A.

FIG. 29 is a flowchart for illustrating the manufacturing method of the electrostatic chuck.

DESCRIPTION OF EMBODIMENTS

Figure 1A:
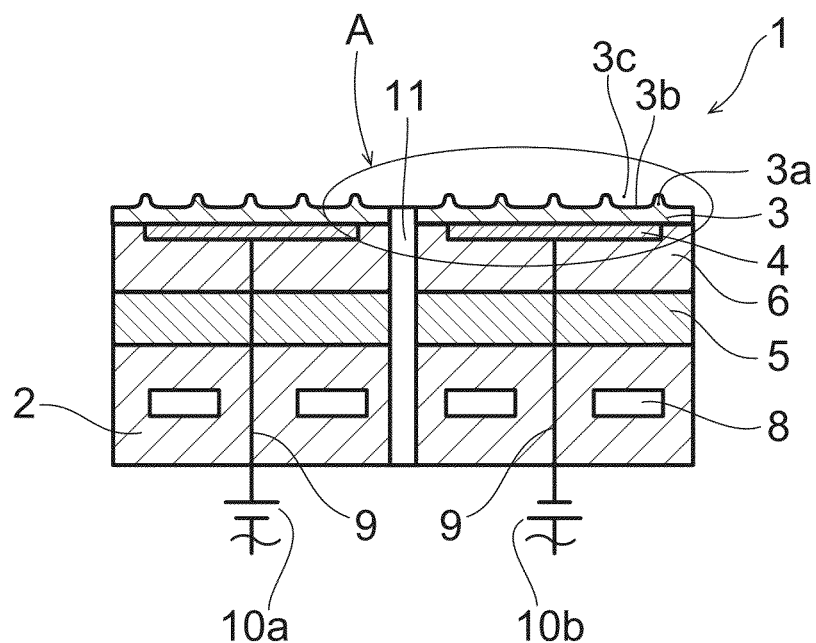
FIG. 1A is a schematic cross-sectional view for illustrating the electrostatic chuck.

Hereinafter, embodiments of the invention will be described below with reference to the drawings. Note that the same numerals are applied to similar constituent elements in the drawings and detailed descriptions of such constituent elements are appropriately omitted.

Figure 1B:
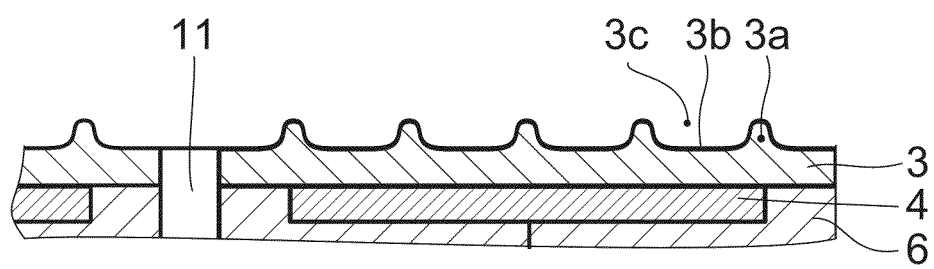
FIG. 1B is a schematic magnified view of the A part in FIG. 1A.

FIGS. 1A and 1B are schematic cross-sectional views for illustrating an electrostatic chuck according to the embodiment.

FIG. 1A is a schematic cross-sectional view for illustrating the electrostatic chuck, and FIG. 1B is a schematic magnified view of the A part in FIG. 1A.

As shown in FIGS. 1A and 1B, a base 2, a dielectric substrate 3, and an electrode 4 are provided on the electrostatic chuck 1.

An insulator layer 5 made of an inorganic material is formed on a first major surface (the surface of the electrode 4 side) of the base 2. The dielectric substrate 3 has a protrusion 3a formed on a major surface of the side on which the adsorption target material is mounted (mounting face side) and a planar surface part 3b formed in the periphery of the protrusion 3a. The top face of the protrusion 3a becomes the mounting face when mounting the adsorption target material such as a semiconductor wafer. A detailed description will be given hereinafter concerning the surface design and the cross-sectional shape of the protrusion 3a and the planar surface part 3b.

A major surface of the dielectric substrate 3 on which the electrode 4 is provided, and a major surface of the base 2 on which the insulator layer 5 is provided, are adhered by an insulating adhesive. This insulating adhesive cures to become a bonding layer 6.

The electrode 4 and a power source 10a and a power source 10b are connected by an electric wire 9. Although the electric wire 9 is provided so as to pass through the base 2, the electric wire 9 and the base 2 are insulated. FIGS. 1A and 1B illustrate a so-called bipolar type electrostatic chuck formed on the dielectric substrate 3 in which the positive and negative electrodes are mutually adjacent. However, it is not limited to this, and it may also be applied to a so-called unipolar type electrostatic chuck in which a single electrode is formed on the dielectric substrate 3, and a tri-polar type and other mufti-polar types are also possible. The number, shape, and arrangement of electrodes can also be suitably modified.

A through hole 11 is provided so as to pass through the electrostatic chuck 1. A first end of the through hole 11 opens in the planar surface part 3b, while a second end is connected to gas supply means (not illustrated) via pressure control means and flow control means (also not illustrated). The gas supply means (not illustrated) supplies helium gas, argon gas, or the like. Furthermore, spaces 3c provided by the formation of the planar surface part 3b become the supply paths for the gas. The spaces 3c respectively communicate with each other such that the supplied gas is diffused over the entirety.

Ring-form protrusions (not illustrated) may be provided in positions to support peripheral parts of the adsorption target material when adsorption target material, such as a semiconductor wafer, is mounted, and the gas described above can also be provided so as to not leak out. If through holes other than the through holes 11 for the gas supply described above are provided, then the ring-form protrusions (not illustrated) may be provided around the through holes thereof, and the gas described above can also be provided so as to not leak out.

The surface design and cross-sectional shape of this type of the ring-form protrusions (not illustrated) may also be provided in a similar manner as the protrusion 3a.

In addition, not illustrated gas distribution channels (concave shaped grooves) having a radial or concentric circular shape that communicates with the through holes 11 may be provided in the planar surface part 3b. Providing this type of gas distribution channel may quicken the gas distribution rate.

The base 2 may be formed of a metal having high thermal conductivity such as, for example, an aluminum alloy or copper. Furthermore, a fluid channel 8 may be provided in which a cooling fluid or a heating fluid flows therein. The fluid channel 8 is not absolutely necessary but that providing such is preferred from the aspect of temperature control of the adsorption target material.

The insulator layer 5 provided on the first major surface of the base 2 may be formed from a polycrystalline body such as alumina ($Al_2O_3$) or yttria ($Y_2O_3$) or the like. A configuration is preferred such that the thermal conductivity of the insulator layer 5 is greater than the thermal conductivity of the bonding layer 6. In this case, it is preferred that the thermal conductivity of the insulator layer 5 is not less than 2 W/mK. By doing so, the heat transference becomes more favorable than with the bonding layer alone, and thus the temperature controllability of the adsorption target material and the uniformity of the in-plane temperature can be further improved.

A high thermal conductivity is preferred for the bonding layer 6. It is preferred that the thermal conductivity be, for example, not less than 1 W/mK and more preferably not less than 1.6 W/mK. This type of thermal conductivity can be obtained by adding, for example, alumina or aluminum nitride as a filler into a silicon resin or the like. Further, the thermal conductivity can be adjusted by the ratio of the additives.

The thickness of the bonding layer 6 is preferably to be as thin as possible in consideration of heat transference. On the other hand, when considering peeling of the bonding layer 6 due to heat shear stress caused by the difference between the thermal expansion coefficient of the base 2 and the thermal expansion coefficient of the dielectric substrate 3, the thickness of the bonding layer 6 is preferably to be as thick as possible. Therefore, in consideration of this, the thickness of the bonding layer 6 is preferably to be not less than 0.1 mm and not more than 0.3 mm.

Various materials can be used for the dielectric substrate 3 depending on the various demands required by the electrostatic chuck. In this case, when considering the reliability of thermal conductivity and electrical insulation, use of a polycrystalline ceramics sintered body is preferred. Examples of polycrystalline ceramics sintered bodies include polycrystalline ceramic sintered bodies made of, for example, alumina, yttria, aluminum nitride, silicon carbide, and the like.

The volume resistivity of the material of the dielectric substrate 3 can be not less than $10^8$ Ωcm in the operating temperature range of the electrostatic chuck.

The volume resistivity in this specification is a value measured by using the method indicated in the JIS Standard (JIS C 2141:1992 ceramics material test method for electrical insulation). The measurement in this case can be performed in the operating temperature range (for example, room temperature (approximately 25° C.)) of the electrostatic chuck.

The dielectric substrate 3 is preferably made from a polycrystalline ceramics sintered body with an average grain diameter of the crystal grains of not less than 0.8 μm and not more than 1.5 μm. The dielectric substrate 3 is more preferably made from a polycrystalline ceramics sintered body with an average grain diameter of the crystal grains of not less than 1 μm and not more than 1.5 μm. As long as a material made of a polycrystalline ceramics sintered body with an average grain diameter of the crystal grains of not less than 0.8 μm and not more than 1.5 μm is used, shedding of the crystal grains from the dielectric substrate 3 can be more securely suppressed. The changing of the shape of the protrusion 3a can be suppressed even if crystal grains are shed. A detailed description will be given hereinafter concerning the average grain diameter of the crystal grains of the polycrystalline ceramics sintered body that configures the dielectric substrate 3.

Examples of material for the electrode 4 include titanium oxide, the chemical element titanium or a mixture of titanium and titanium oxide, titanium nitride, titanium carbide, tungsten, gold, silver, copper, aluminum, chrome, nickel, a gold and platinum alloy, or the like.

Next, a description will be further given concerning the surface design and the cross-sectional shape of the protrusion 3a and the planar surface part 3b. The top face of the protrusion 3a becomes the mounting face when mounting the adsorption target material. Therefore, conventionally, in order to reduce the generation of particles, the top face of the protrusion was a flat face while buffing and mirror polishing were performed such that micro-asperity was not formed in the top face (for example, see Patent literature 1 and Patent literature 2).

However, as a result of the study by the inventors, it has become evident that making the top face of the protrusion to be a flat face such that micro-asperity is not formed in the top face instead leads to an increase in the number of particles.

Figure 2:
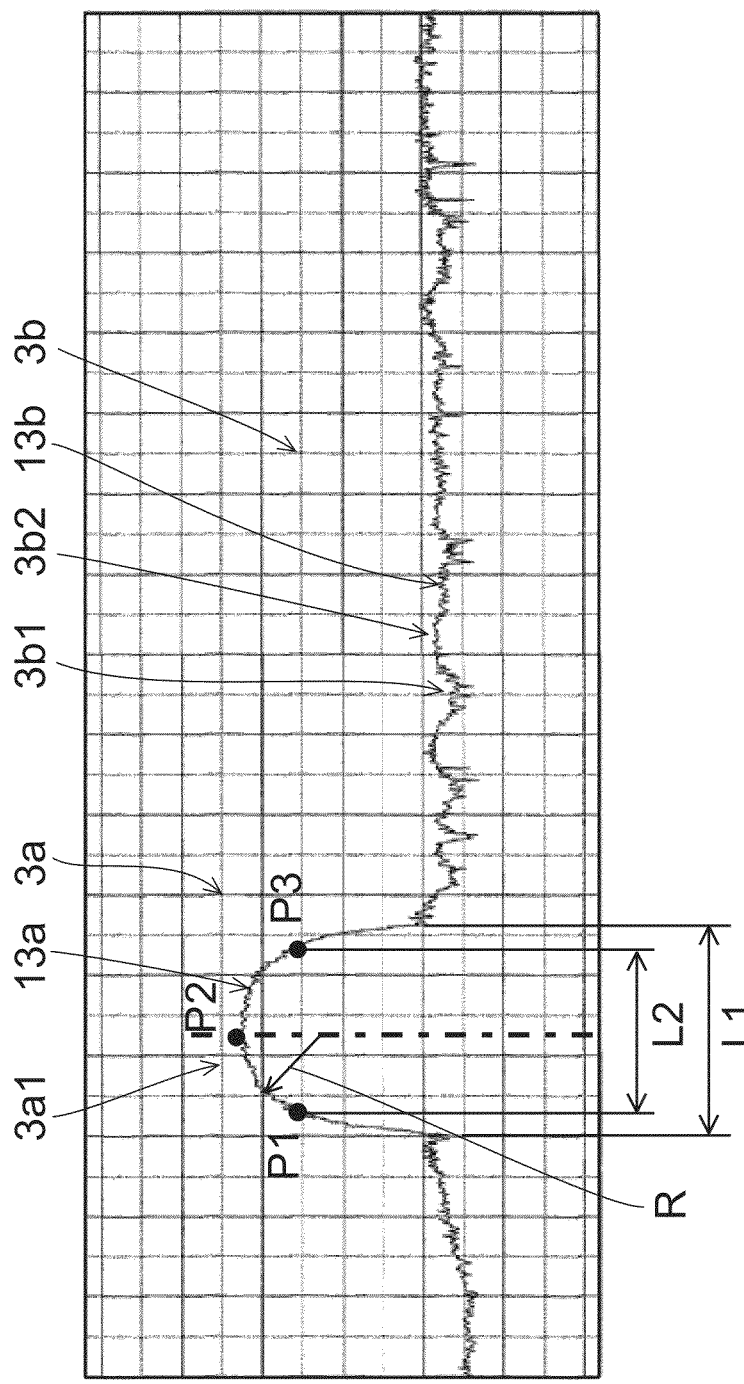
FIG. 2 is a graph for illustrating the surface design and cross-sectional shape of the protrusion and the planar surface part.
Figure 3:
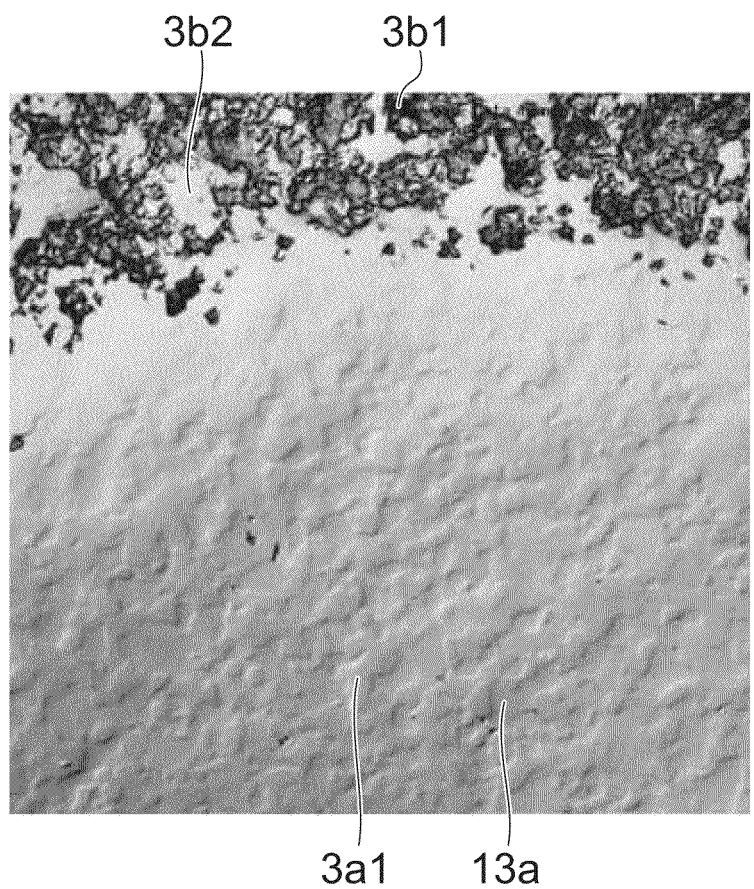
FIG. 3 is a laser microscope photograph for illustrating the micro recess formed in the top face of the protrusion.
Figure 4:
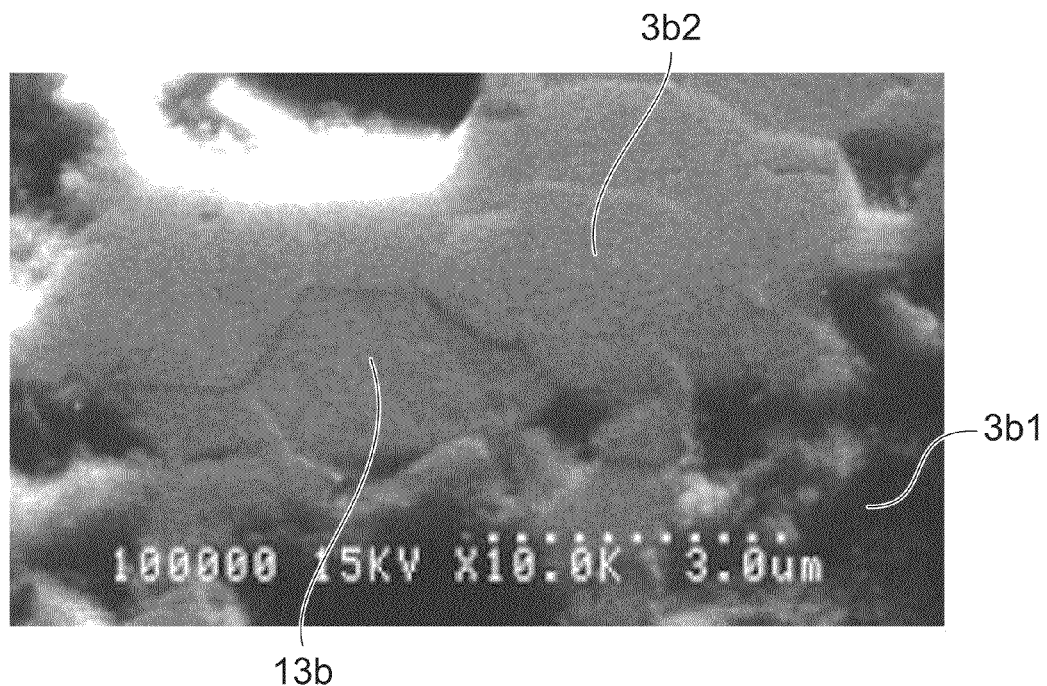
FIG. 4 is a scanning electron microscope photograph for illustrating the micro recess formed in the flat part.

Therefore, in the embodiment, a top face 3a1 of the protrusion 3a is a curved surface while also forming a micro recess 13a (first recess) on the top face 3a1 (See FIG. 2, FIG. 3 and FIG. 4).

The depth of the micro recess 13a has a dimension based on the crystal grain diameter. In this case, the depth dimension of the micro recess 13a is preferably not less than 30 nm and not more than 150 nm (see FIG. 25).

Here, shapes that are close to the protrusion 3a and the planar surface part 3b are formed by using a sandblast method to erode away the periphery of the portion that is to be the protrusion 3a. Thus, in this manner a plurality of holes 3b1 that open in the planar surface part 3b are formed in the planar surface part 3b.

As will be described hereinafter, a flat part 3b2 is formed in the periphery of the opening of the hole 3b1 that opens in the planar surface part 3b.

Furthermore, in the embodiment, a micro recess 13b (second recess) is also formed in the flat part 3b2.

The depth dimension of the micro recess 13b is not more than 30 nm, and preferably not more than 20 nm, and more preferably not less than 5 nm and not more than 20 nm.

FIG. 2 is a graph for illustrating the surface design and cross-sectional shape of the protrusion and the planar surface part.

FIG. 2 shows the results on measurement of the surface of the protrusion and the planar surface part using a contact type roughness meter.

As shown in FIG. 2, the top face 3a1 of the protrusion 3a has a curved surface that projects toward the outer side. Furthermore, the micro recess 13a is formed in the top face 3a1 of the protrusion 3a.

A plurality of holes 3b1 that open in the planar surface part 3b, and the flat part 3b2 formed in the periphery of the opening of the holes 3b1, are formed in the planar surface part 3b. Furthermore, the micro recess 13b is formed in the flat part 3b2.

Here, an explanation will be given for the "top face" in this specification.

As shown in FIG. 2, the term "top face" in this specification refers to a portion that is within the length of L2 equidistant from the center axis of the protrusion 3a. Here, L2 is a length that is 80% of the length L1 of the bottom of the protrusion 3a.

As long as the top face 3a1 of the protrusion 3a has a curved surface, the outer side of the top face 3a1 may be a curved surface or it may be a linear surface.

Next, an explanation will be given for the "curvature radius R" in this specification.

As shown in FIG. 2, the positions of both end portions of the top face 3a1 are P1 and P3, and the center position (the intersecting point position of the top face 3a1 and the center axis of the protrusion 3a) of the top face 3a1 is P2. A radius of the circle that passes through P1, P2, and P3 is the "curvature radius R" of the curved surface in this specification.

The center position of the circle that passes through P1, P2, and P3 is the intersecting point of the perpendicular bisector of the line segment that connects P1 and P2 and the perpendicular bisector of the line segment that connects P3 and P2. Therefore, the "curvature radius R" of the curved surface can be obtained by deriving the center position of the circle that passes through P1, P2, and P3 from the positions of P1, P2, and P3, and deriving the distance to any one of P1, P2, or P 3 from the center position of the circle.

According to the findings obtained by the inventors, the curvature radius R of the top face 3a1 is preferably made to be less than the curvature radius of the deformation curve of the plate shaped adsorption target material flexed by the adsorptive force.

By doing so, the shape of the top face 3a1 can accommodate a flexed shape when the adsorption target material with a plate shape undergoes electrostatic adsorption. Therefore, lowering the surface pressure in the contact portion between the underside of the adsorption target material and the top face 3a1, can suppress the generation of particles.

In this case, if the curvature radius R is not more than 20 mm, then the curvature radius of the top face 3a1 can be made to be less than the curvature radius of the deformation curve of the plate shaped adsorption target material flexed by the adsorptive force.

Next, an explanation will be given for the micro recess formed in the top face 3a1 and flat part 3b2.

FIG. 3 is a laser microscope photograph for illustrating the micro recess formed in the top face of the protrusion.

FIG. 4 is a scanning electron microscope photograph for illustrating the micro recess formed in the flat part.

Figure 5:
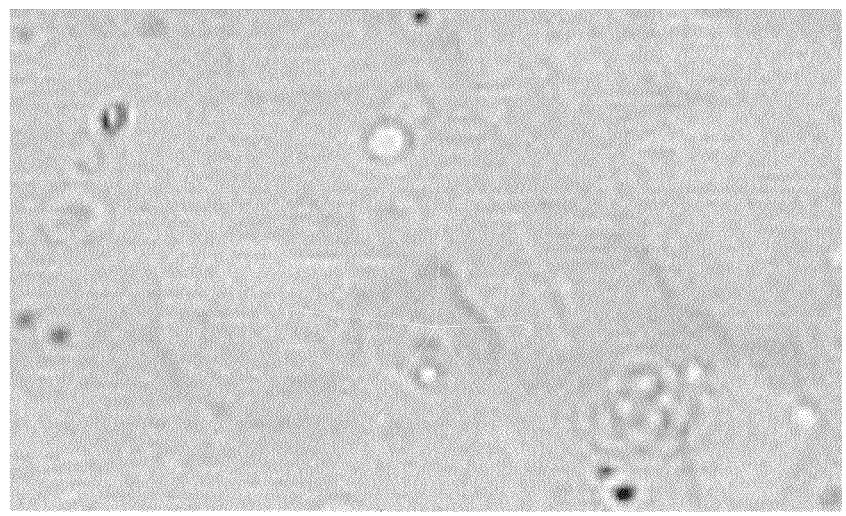
FIG. 5 is a laser microscope photograph for illustrating when the top face is a flat face.

FIG. 5 is a laser microscope photograph for illustrating when the top face 3a1 is made into a flat part.

As shown in FIG. 3, the micro recess 13a is formed in the top face 3a1 of the protrusion 3a.

As shown in FIG. 4, the micro recess 13b is formed in the flat part 3b2.

In FIG. 5, the micro recess 13a is not formed in the top face 3a1.

In FIG. 3 and FIG. 4, the top face 3a1 is a curved surface with a recess 13a is formed. Therefore, the surface area of the contact portion between the top face 3a1 and the underside of the adsorption target material can be greatly reduced. Micro foreign objects can also be captured within the recess 13a.

In contrast to this, because the micro recess 13a is not formed in the top face 3a1 as illustrated in FIG. 5, the surface area of the contact portion between the top face 3a1 and the underside of the adsorption target material is larger. Micro foreign objects also cannot be captured.

Because the recess 13b is formed in the flat part 3b2, the surface area of the contact portion can be greatly reduced even if the underside of the adsorption target material contacts the planar surface part 3b as the adsorption target material flexes. Micro foreign objects can also be captured within the recess 13b.

In other words, reducing the surface area of the contact portion between the underside of the adsorption target material can suppress the generation of particles. Capturing micro foreign objects in the recess 13a and the recess 13b can suppress the generation of particles.

Table 1 and Table 2 illustrate the results of suppressing the generation of particles.

Table 1 shows the examples illustrated in FIG. 3 and FIG. 4 while table 2 shows the examples illustrated in FIG. 5.

In Table 1 and Table 2, the adsorption target material is a semiconductor wafer and the total number of particles adhered to the underside of the semiconductor wafer is made up for each grain of particle.

The number of particles in Table 1 and Table 2 is the total number of particles in a predetermined area and converts such value to the number of particles in the semiconductor wafer of a 300 mm diameter.

TABLE 1

|  | 0.15~0.2 μm | 0.2~0.3 μm | 0.3~0.5 μm | 0.5 μm or more | total |
|---|---|---|---|---|---|
| After washing | 50 | 56 | 27 | 79 | 212 |
| After 10 times adsorption | 25 | 18 | 25 | 47 | 115 |
| After 100 times adsorption | 36 | 29 | 32 | 58 | 155 |
| After 200 times adsorption | 18 | 27 | 20 | 23 | 88 |
| After 300 times adsorption | 29 | 16 | 14 | 16 | 75 |
| After 400 times adsorption | 23 | 16 | 14 | 16 | 69 |
| After 500 times adsorption | 25 | 11 | 14 | 14 | 64 |

TABLE 2

|  | 0.15~0.2 μm | 0.2~0.3 μm | 0.3~0.5 μm | 0.5 μm or more | total |
|---|---|---|---|---|---|
| After washing | 79 | 56 | 9 | 266 | 410 |
| After 1 time adsorption | 232 | 83 | 23 | 387 | 725 |
| After 5 times adsorption | 140 | 45 | 11 | 263 | 459 |
| After 10 times adsorption | 122 | 56 | 9 | 257 | 444 |
| After 15 times adsorption | 140 | 59 | 14 | 189 | 402 |

As can be understood from Table 1, when a micro recess such as that illustrated in FIG. 3 and FIG. 4 is formed, the electrostatic chuck surface is cleaned, the generation of particles can be suppressed even when the electrostatic chuck surface is cleaned and thereafter adsorption of the semiconductor wafer is repeated.

The depth dimension of the recess 13a formed in the top face 3a1 is larger than the depth dimension of the recess 13b formed in the flat part 3b2.

Furthermore, the surface area is wider and the depth is shallower with the recess 13a and the recess 13b, and the side surface of the recess 13a and the recess 13b is a sloped face.

Therefore, foreign objects trapped within the recess 13a and the recess 13b can be easily removed. In other words, the electrostatic chuck surface can be easily recovered to a clean state even if foreign objects have adhered to the electrostatic chuck surface.

In contrast to this, as can be understood from Table 2, when the micro recess is not formed as illustrated in FIG. 5 and the electrostatic chuck surface is cleaned, it stabilizes as is with a large number of particles if attempting to repeat adsorption of the semiconductor wafer thereafter.

The detailed description will be given hereinafter concerning the depth dimension and the shape of the side surface of the recess 13a and 13b.

Table 3 and Table 4 illustrate the recovery of a clean state of the electrostatic chuck surface.

Table 3 shows the examples illustrated in FIG. 3 and FIG. 4 while table 4 shows the examples illustrated in FIG. 5.

In Table 3 and Table 4, the adsorption target material is a semiconductor wafer and the total number of particles adhered to the underside of the semiconductor wafer is made up for each grain of particle.

The number of particles in Table 3 and Table 4 is the total number of particles in a predetermined area and converts such value to the number of particles in the semiconductor wafer of a 300 mm diameter.

Further, "initial state" is when adsorption is performed on a semiconductor wafer while foreign objects are adhered on the electrostatic chuck surface. Further, "No. 1 to No. 5" is when the electrostatic chuck surface is cleaned and adsorption of the semiconductor wafer is performed thereafter. Cleaning is performed by wiping the electrostatic chuck surface with a nonwoven cloth containing an organic solvent.

TABLE 3

|  | 0.15~0.2 μm | 0.2~0.3 μm | 0.3~0.5 μm | 0.5 μm or more | total |
|---|---|---|---|---|---|
| Initial state | 2455 | 2441 | 10676 | 15784 | 31356 |
| No. 1 | 47 | 27 | 54 | 63 | 191 |
| No. 2 | 56 | 25 | 36 | 29 | 146 |
| No. 3 | 34 | 29 | 34 | 32 | 129 |
| No. 4 | 25 | 25 | 27 | 23 | 100 |
| No. 5 | 11 | 14 | 9 | 11 | 45 |

TABLE 4

|  | 0.15~0.2 μm | 0.2~0.3 μm | 0.3~0.5 μm | 0.5 μm or more | total |
|---|---|---|---|---|---|
| Initial state | 1577 | 2084 | 9295 | 16135 | 29091 |
| No. 1 | 146 | 79 | 54 | 303 | 582 |
| No. 2 | 101 | 70 | 41 | 299 | 511 |
| No. 3 | 124 | 77 | 47 | 266 | 514 |
| No. 4 | 100 | 69 | 40 | 200 | 409 |
| No. 5 | 90 | 77 | 66 | 184 | 417 |

As can be seen from No. 1 of Table 3, when a micro recess is formed such as that illustrated in FIG. 3 and FIG. 4, the number of particles adhered to the underside of the semiconductor wafer can be greatly reduced even when cleaning the electrostatic chuck surface just by wiping with a nonwoven cloth that contains an organic solvent. This means that the electrostatic chuck surface can be easily recovered to a clean state even if foreign objects have adhered to the electrostatic chuck surface.

The depth dimension of the recess 13a and the depth dimension of the recess 13b are less than the average grain diameter of the crystal grains of the polycrystalline ceramics sintered body that configures the dielectric substrate 3.

By doing this, the generation of particles can be suppressed in addition to easily recovering a clean state of the electrostatic chuck surface.

The micro recesses 13a and 13b that will be described hereinafter are formed by using a CMP method to be described later.

Figure 6A:
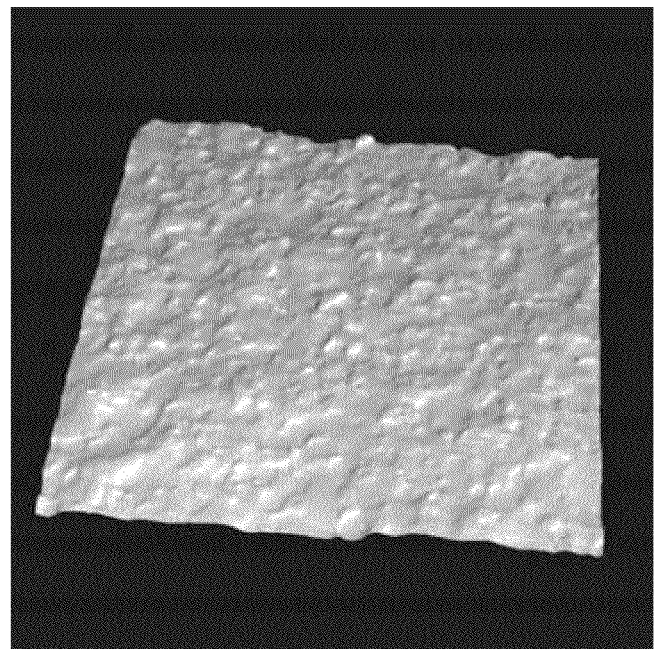
FIGS. 6A to 6C are diagrams for illustrating the shape of the recess 13a formed in the top face 3a1.
Figure 6B:
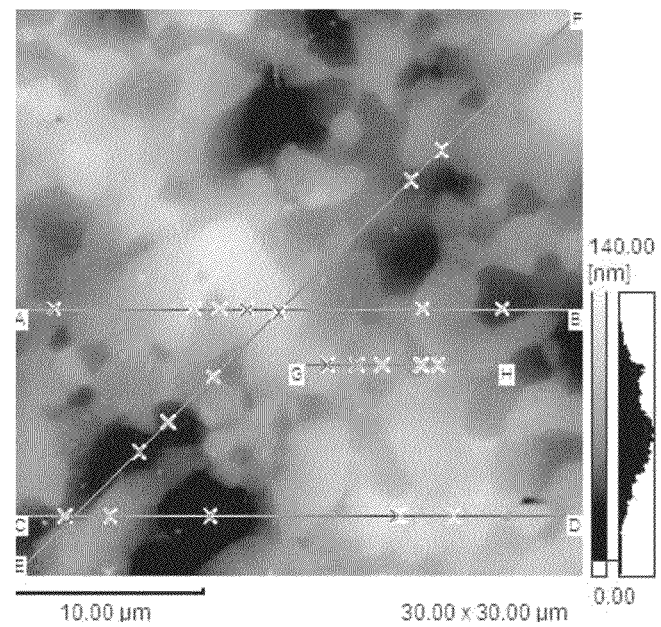
Figure 6C:
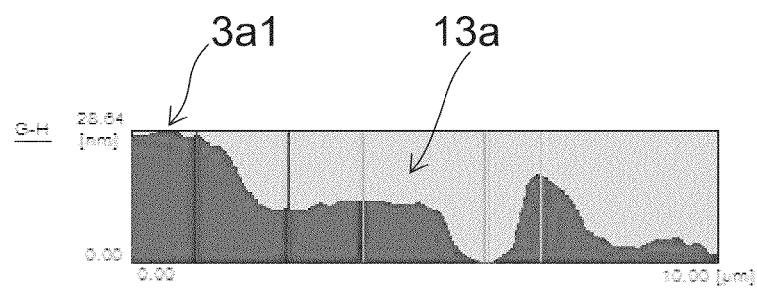

FIGS. 6A to 6C are diagrams for illustrating the shape of the recess 13a formed in the top face 3a1. FIG. 6A is a three-dimensional image of the recess 13a, and FIGS. 6B and 6C are diagrams for illustrating the profile of the recess 13a.

Figure 7A:
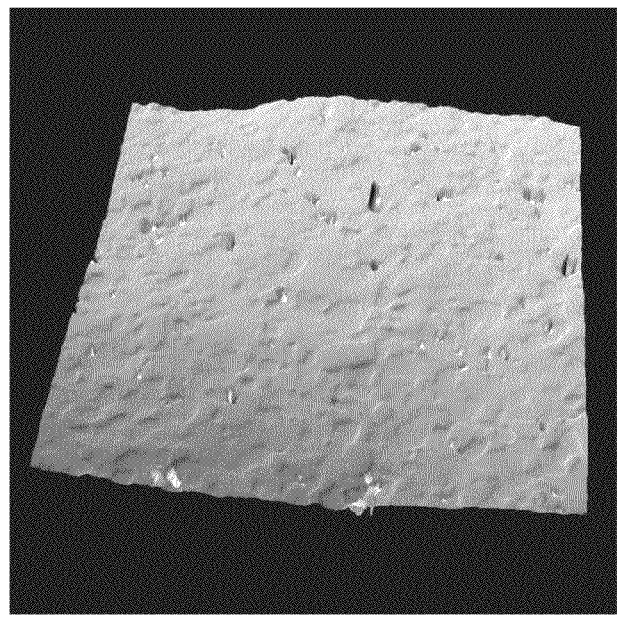
FIGS. 7A to 7C are diagrams for illustrating the shape of the recess 13b formed in the flat part 3b2.
Figure 7B:
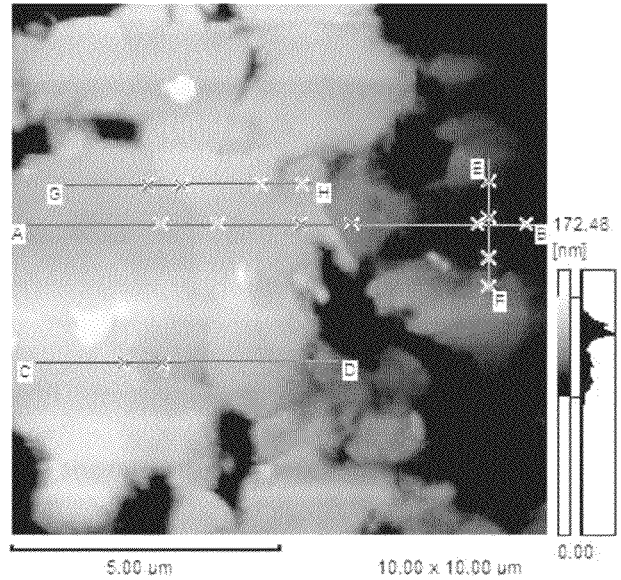
Figure 7C:
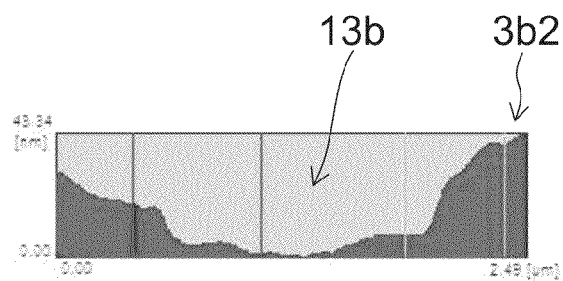

FIGS. 7A to 7C are diagrams for illustrating the shape of the recess 13b formed in the flat part 3b2. FIG. 7A is a three-dimensional image of the recess 13b, and FIGS. 7B and 7C are diagrams for illustrating the profile of the recess 13b.

As shown in FIGS. 6A to 6C, a side surface of the recess 13a is a sloped face, and an angle between a bottom surface of the recess 13a and the side surface of the recessed 13a (angle of the sloped face) is an obtuse angle. A portion where the side surface of the recess 13a meets the top face 3a1, and a portion where the side surface of the recess 13a meets the bottom surface of the recess 13a are shaped like a continual roundness.

As shown in FIGS. 7A to 7C, the side surface of the recess 13b is a sloped face, and the angle (angle of the sloped face) formed by the bottom surface of the recess 13b and the side surface of the recessed 13b is an obtuse angle. The portion where the side surface of the recess 13b meets the flat part 3b2 and the portion where the side surface of the recess 13b meets the bottom surface of the recess 13b are shaped like a continual roundness.

The obtuse angle in this specification is an angle that is greater than 90 degrees but less than 180 degrees.

A shape like a continual roundness refers to rounding a corner by chemical erosion during the use of a CMP method to be described below, and is a state where the side surface of the recess 13a meets the top face 3a1, and the portion where the side surface of the recess 13a meets the bottom surface of the recess 13a and where the side surface of the recess 13b meets the flat part 3b2 and the portion where the side surface of the recess 13b meets the bottom surface of the recess 13b to smoothly connect.

Therefore, because the portion that becomes negative when cleaning the electrostatic chuck surface is eliminated, recovery of a clean state of the electrostatic chuck surface can be more securely and easily performed.

In other words, because the side surface portion of the recess 13a and recess 13b having a shallow depth is a continuous gentle shape, the contact area with cleaning equipment, such as a nonwoven cloth, can be larger. Thus, micro foreign objects can be smoothly removed even when cleaning just by wiping with a nonwoven cloth that contains an organic solvent.

In contrast to this, as can be seen from Table 4, when a micro recess is not formed such as that illustrated in FIG. 5, the number of particles cannot be greatly reduced when cleaning the electrostatic chuck surface just by wiping with a nonwoven cloth that contains an organic solvent.

In the electrostatic chuck 1 according to the embodiment, the portion where the side surface of the protrusion 3a meets the top face 3a1 and the portion where the side surface of the protrusion 3a beats the planar surface part 3b are shaped like a continual roundness. In other words, the side surface of the protrusion 3a and the top face 3a1 are curved surfaces that smoothly connect; and the side surface of the protrusion 3a and the planar surface part 3b are curved surfaces that smoothly connect.

(CMP Processing)

The recess 13a and recess 13b having the shapes described above cannot be formed in to the top face 3a1 and the flat part 3b2 using mechanical processing methods such as buffing, grinding processing, laser engraving, shot blasting, sand blasting, or the like. Further, the protrusion 3a having the shape described above cannot be formed using these mechanical processing methods.

Descriptions are given below of the formation methods of the protrusion 3a, planar surface part 3b, flat part 3b2, hole 3b1, recess 13a, recess 13b, and the like.

First, shapes that are close to the protrusion 3a and the planar surface part 3b are formed.

For example, the portion that will become the protrusion 3a is masked, and shapes that are close to the protrusion 3a and the planar surface part 3b are formed by using a sandblast method to erode away the portion that is not masked. At this time, a plurality of holes 3b1 that open in the planar surface part 3b are formed in the planar surface part 3b. As long as this type of hole 3b1 is formed, foreign objects can be captured in the plurality of holes thus suppressing the generation of particles.

In this case, the depth dimension of the holes 3b1 is preferred to be less than the average grain diameter (not less than 0.8 μm and not more than 1.5 μm) of the crystal grains of the polycrystalline ceramics sintered body to be described below. With this type of shallow hole, foreign objects captured in the holes 3b1 can be easily removed. A detailed description will be given hereinafter for the average grain diameter of the crystal grains of the polycrystalline ceramics sintered body.

Figure 8:
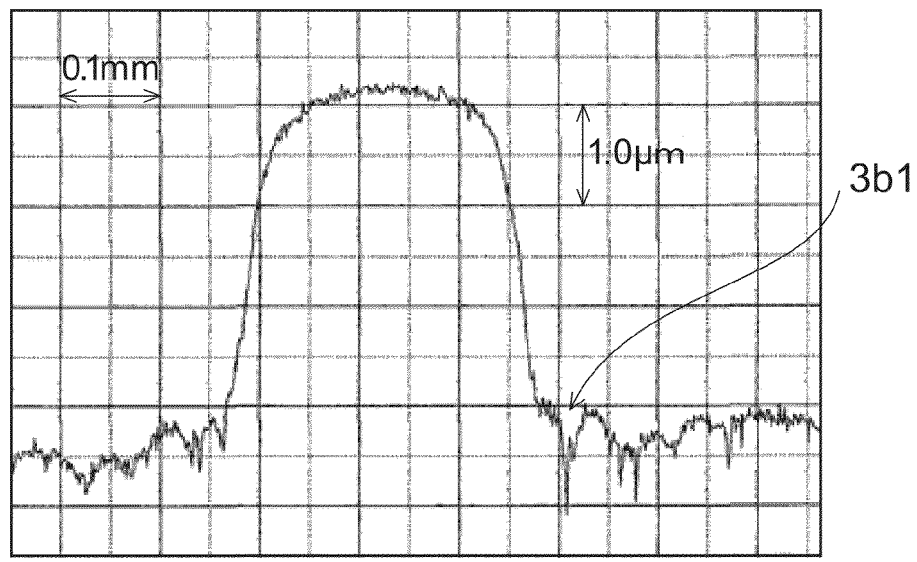
FIG. 8 is a graph for illustrating the depth dimension of the holes that open in the planar surface part.

FIG. 8 is a graph for illustrating the depth dimension of the holes 3b1 that open in the planar surface part 3b.

As shown in FIG. 8, the depth dimension of the holes 3b1 is less than 1 μm, and crystal grains shed from the polycrystalline ceramics sintered body that have entered into the holes 3b1 can be easily removed. The depth dimension of the holes 3b1 can be controlled by the processing conditions (for example, the size of the grinding material used and the like) in the sandblast method or the like.

Next, the mask is removed and the protrusion 3a is processed into the shape described above. At this time, the flat part 3b2 is formed in the periphery of the opening of the plurality of holes 3b1 that open in the planar surface part 3b. Furthermore, the micro recess 13a described above is formed in the top face 3a1 of the protrusion 3a, and the micro recess 13b described above is formed in the flat part 3b2.

In this case, according to the findings obtained by the inventors, the protrusion 3a, the flat part 3b2, the recess 13a, and the recess 13b can be formed in one step if a chemical mechanical polishing (CMP) method is used.

The CMP method is generally used when performing planarization processing. Therefore, it would not be considered for forming the protrusion 3a having the shape such as that described above as well as being able to form the micro recesses 13a and 13b.

However, according to the findings obtained by the inventors, the micro recesses 13a and 13b can be formed if utilizing the active effect of chemical components contained in slurry.

In other words, the micro recesses 13a and 13b can be formed if utilizing the crystal orientation dependence relative to the etching rate found in the polycrystalline ceramics sintered body. In other words, in the surface region of the polycrystalline ceramics sintered body, the micro recesses 13a and 13b can be formed because the areas having crystal orientation for easy etching are etched first.

The protrusion 3a and the flat part 3b2 can be formed by the mechanical polishing effect due to the abrasive grains contained in the slurry, and by the chemical polishing effect due to the chemical components contained in the slurry. In this case, the flat part 3b2 is formed in the periphery of the holes 3b1.

Here, an illustration will be given of the process conditions for the CMP method.

A polishing cloth, such as a rigid polyurethane foam polishing cloth, can be used. A rotating speed of 60 RPM can be used for a grinder, and a load of 0.2 kg/cm² can be used. The abrasive grains contained in the slurry that can be used include $SiO_2$ (silicon oxide), $CeO_2$ (cerium oxide), $TiO_2$ (titanium oxide), MgO (magnesium oxide), $Y_2O_3$ (yttrium oxide), and $SnO_2$ (tin oxide). Further, the ratio of abrasive grains to slurry can be approximately between 10 to 20 wt %. Examples of chemical components contained in the slurry that can be used include pH adjusters, dispersing agents for the abrasive grains, surfactants, and the like. In this case, when considering crystal anisotropy etching described above, an alkaline slurry is preferred. Therefore, the hydrogen ion exponent of the slurry would be between approximately pH 8 to 13. Note that the supplied amount of slurry can be, for example, approximately 20 cc per min.

Furthermore, according to the findings obtained by the inventors, processing time becomes an essential element.

In other words, with a short processing time it becomes a flattening process and the protrusion 3a having the shape described above cannot be formed, and further, the micro recesses 13a and 13b cannot be formed. For example, a processing time of approximately several minutes is a flattening process.

On the other hand, with a short processing time of approximately several hours, the protrusion 3a having the shape described above can be formed, and further, the micro recesses 13a and 13b can be formed.

Because the top face 3a1 of the protrusion 3a is easier to process then the planar surface part 3b, a relationship between the depth dimension of the recess 13a described above and the depth dimension of the recess 13b can be configured. In other words, the depth dimension of the recess 13a formed in the top face 3a1 can be made so as to be greater than the depth dimension of the recess 13b formed in the flat part 3b2.

The processing time described above can be appropriately modified according to such other processing conditions (for example, the hydrogen ion exponent or the like of the slurry) in the CMP method.

Consideration can also be given to the interference fringe space occupancy ratio to be described hereinafter. In other words, processing by the CMP method can be performed not only to form the recess 13a and the recess 13b but also until the interference fringe space occupancy ratio to be described hereinafter becomes less than 1%. A detailed description will be given hereinafter concerning the interference fringe space occupancy ratio and the like.

A height dimension of the protrusion 3a can be made to be greater than the average grain diameter of crystal grains of the polycrystalline ceramics sintered body to be described hereinafter. Or, the average grain diameter of crystal grains of the polycrystalline ceramics sintered body can be made to be less than the height dimension of the protrusion 3a.

By doing so, the shedding of crystal grains from the dielectric substrate 3 can be suppressed. Further, the changing of the shape of the protrusion 3a can be suppressed even if crystal grains are shed.

Figure 9:
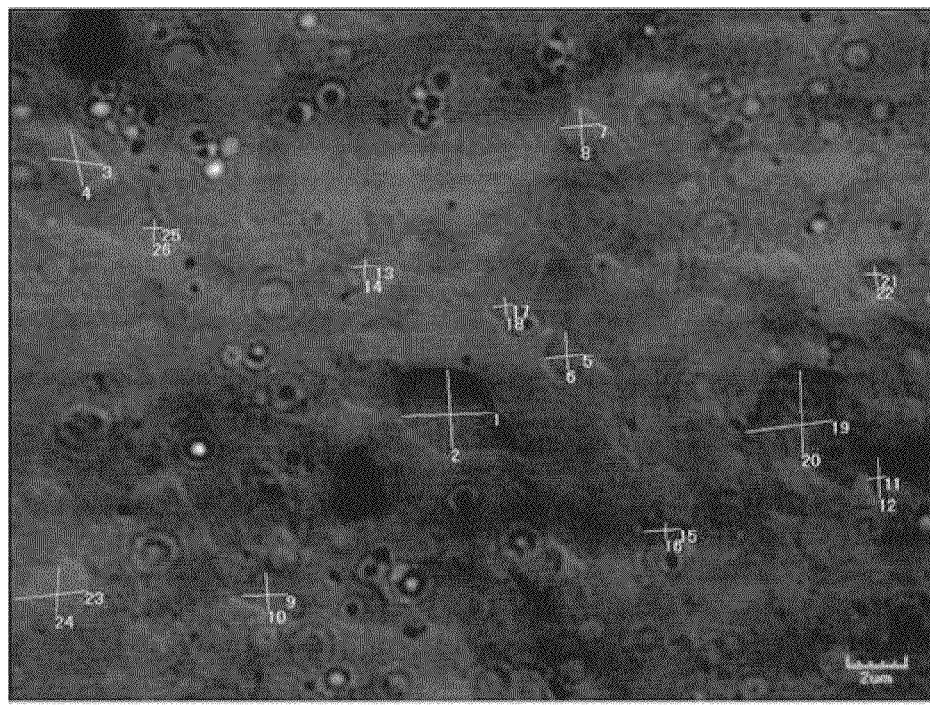
FIG. 9 is a laser microscope photograph for illustrating the dimension of the length of the micro recess.

FIG. 9 is a laser microscope photograph for illustrating the measurement of the length of the micro recess.

Figure 10:
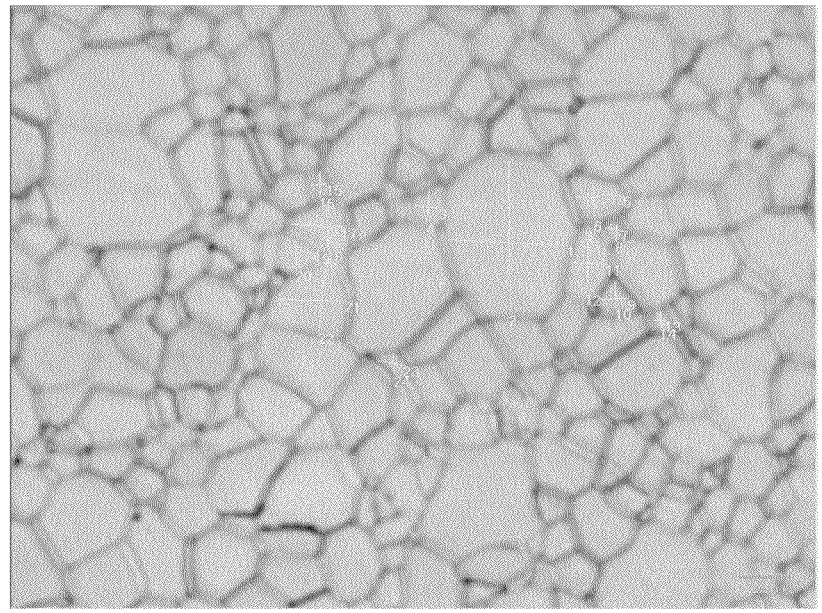
FIG. 10 is a laser microscope photograph for illustrating the dimension of the crystal grains that appeared on the surface of the polycrystalline ceramics sintered body.

FIG. 10 is a laser microscope photograph for illustrating the measurement of the crystal grains that appeared on the surface of the polycrystalline ceramics sintered body.

The numerical values in FIG. 9 and FIG. 10 express the measurement location and the measurement number.

Table 5 is a table showing the measurement results in FIG. 9, and Table 6 is a table showing the measurement results in FIG. 10.

TABLE 5

| | Measurement Number | | | | | | | |
|---|---|---|---|---|---|---|---|---|
| | 1 | 2 | 3 | 4 | 5 | 6 | 7 | 8 |
| Length (μm) | 3.187 | 2.684 | 1.854 | 1.825 | 1.563 | 1.351 | 1.233 | 1.643 |
| | Measurement Number | | | | | | | |
| | 9 | 10 | 11 | 12 | 13 | 14 | 15 | 16 |
| Length (μm) | 1.334 | 0.631 | 1.498 | 0.875 | 0.709 | 1.252 | 0.554 | 0.699 |
| | Measurement Number | | | | | | | |
| | 17 | 18 | 19 | 20 | 21 | 22 | 23 | 24 | AVE |
| Length (μm) | 0.698 | 3.145 | 2.835 | 0.656 | 0.789 | 0.889 | 2.657 | 1.666 | 1.509 |

TABLE 6

| | Measurement Number | | | | | | | |
|---|---|---|---|---|---|---|---|---|
| | 1 | 2 | 3 | 4 | 5 | 6 | 7 | 8 |
| Length (μm) | 4.66 | 6.106 | 0.848 | 1.016 | 1.804 | 1.201 | 0.437 | 0.647 |
| | Measurement Number | | | | | | | |
| | 9 | 10 | 11 | 12 | 13 | 14 | 15 | 16 |
| Length (μm) | 1.249 | 1.11 | 1.374 | 2.407 | 0.656 | 0.708 | 0.563 | 0.898 |
| | Measurement Number | | | | | | | |
| | 17 | 18 | 19 | 20 | 21 | 22 | 23 | 24 | AVE |
| Length (μm) | 2.186 | 1.633 | 1.406 | 1.047 | 2.88 | 2.404 | 1.032 | 0.832 | 1.629 |

As can be seen from Table 5 and Table 6, the length of the micro recess and the length of the crystal grains that appeared on the surface of the polycrystalline ceramics sintered body can be said to be approximately the same.

This shows that the micro recess is formed to correspond to the crystal grains that appeared on the surface of the polycrystalline ceramics sintered body.

According to the CMP method that relates to the embodiment, the protrusion 3a, the flat part 3b2, the recess 13a, and the recessed 13b can be easily and securely formed. This can be performed such that the interference fringe space occupancy ratio to be described hereinafter becomes less than 1%.

(Quantitative Evaluation Method for Defective Parts)

Next, a description will be given concerning a quantitative evaluation method for defective parts such as cracks that reside within the surface region of the dielectric substrate 3.

First, a description will be given concerning defective parts such as cracks that reside within the surface region of the dielectric substrate 3.

Figure 11:
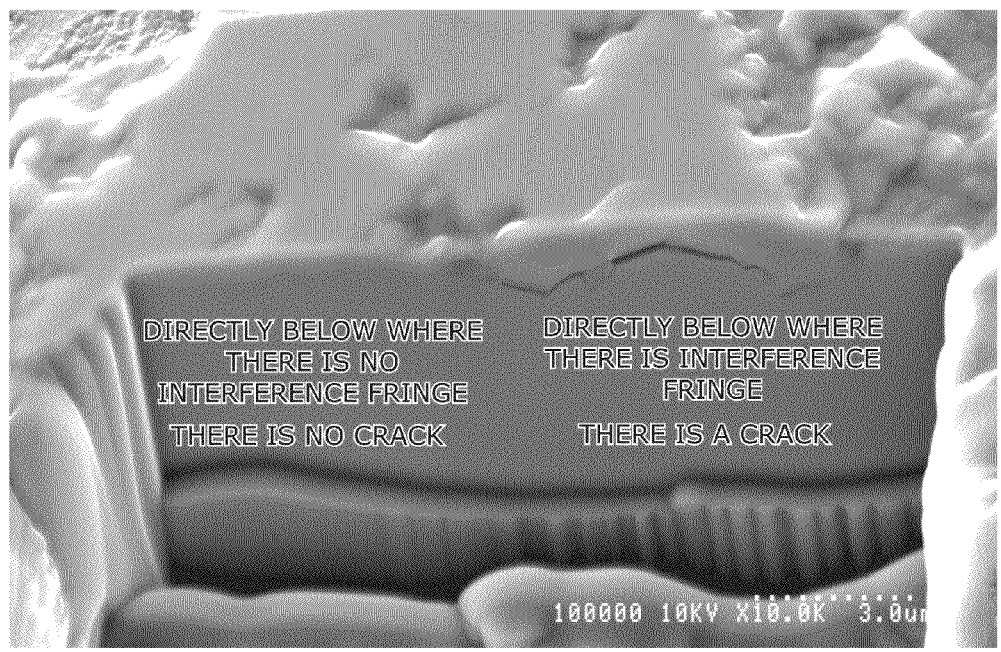
FIG. 11 is a scanning electron microscope photograph for illustrating cracks generated in the surface region of the dielectric substrate.

FIG. 11 is a scanning electron microscope photograph for illustrating cracks generated in the surface region of the dielectric substrate 3.

Figure 12:
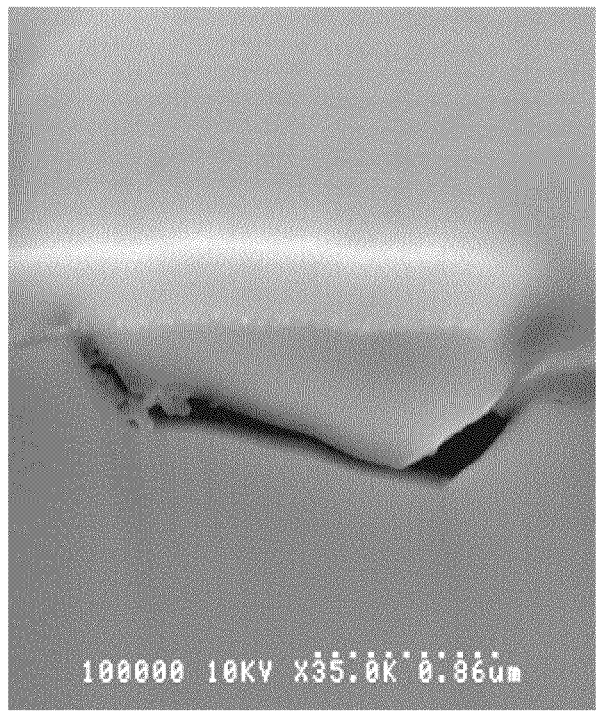
FIG. 12 is a scanning electron microscope photograph for illustrating the situation where a portion of the surface region is likely to desorb.

FIG. 12 is a scanning electron microscope photograph for illustrating the situation of where a portion of the surface region appears likely to desorb.

When the recessed part 3a and the planar surface part 3b are formed by using a mechanical processing method such as sand blasting, a defect such as a crack may occur in the surface region of the dielectric substrate 3 as shown in FIG. 11.

When this type of defect resides within the surface region, a portion of the surface region appears likely to desorb and may eventually desorb, as shown in FIG. 12.

Examples of generated cracks are those that occur in the crystal grain boundary, those that pass through within the crystal grain boundary, and those in which these connect irregularly.

Because portions of the surface region that desorb in this manner become particles, it is preferred that defective parts are removed to a predetermined ratio. In order to do this, a quantitative evaluation on the genesis location of the defect and the degree of incidence (incidence rate) and the like is required.

However, defective parts such as cracks that reside in the surface region of the dielectric substrate 3 are not directly visible from the outside. In other words, conventionally, a nondestructive quantitative evaluation for defective parts was difficult.

Next, a description will be provided for a quantitative evaluation method for defective parts according to the embodiment.

According to findings obtained by the inventors, photographing the surface of the dielectric substrate 3 by a laser microscope shows that portions where defective parts reside have interference fringe. In other words, the interference fringe occurs based on the optical path length difference of reflected light from two interfaces, namely, the surface of the dielectric substrate 3 and the surface of the defect.

FIGS. 13A to 13C are laser microscope photographs for illustrating when a defect resides in the top face 3a1 of the protrusion 3a. FIG. 13A is a laser microscope photograph for illustrating the interference fringe that occurs in the portion where a defect resides; and FIG. 13B is a scanning electron microscope (SEM) photograph of the cross-section on the B-B line in FIG. 13A. Further, FIG. 13C is a magnified photograph of the D part in FIG. 13B; and FIG. 13D is a scanning electron microscope photograph of the same portion as FIG. 13A.

Figure 14A:
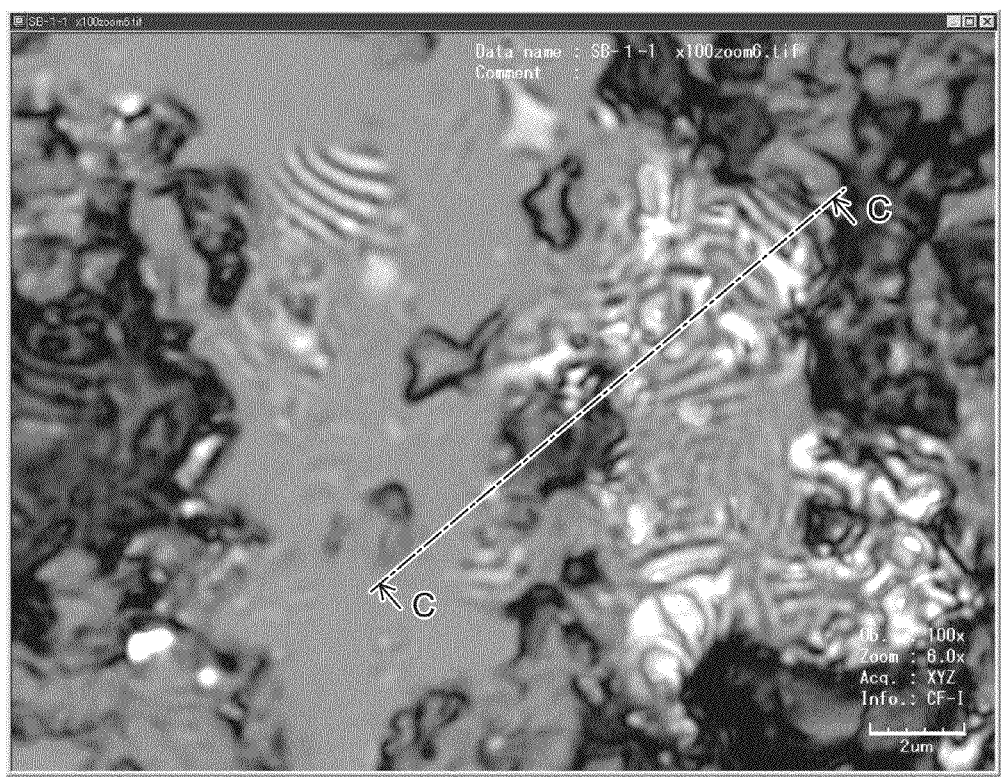
FIG. 14A is a laser microscope photograph for illustrating the interference fringe that occurs in the portion where a defect resides.
Figure 14B:
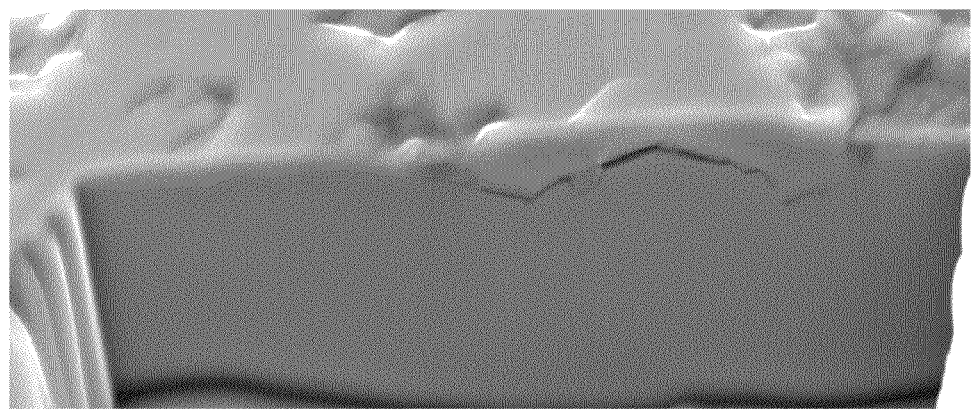
FIG. 14B is a scanning electron microscope photograph of the cross-section on the C—C line in FIG. 14A.

FIGS. 14A and 14B are laser microscope photographs for illustrating when a defect resides in the flat part 3b2 of the planar surface part 3b. FIG. 14A is a laser microscope photograph for illustrating the interference fringe that occurs in the portion where a defect resides; and FIG. 14B is a scanning electron microscope photograph of the cross-section on the C—C line in FIG. 14A.

In this case, as shown in FIG. 13D, a defect residing in the surface region can be identified when observed using a scanning electron microscope.

Meanwhile, according to the quantitative evaluation method that relates to the embodiment, a defect such as a crack that is not directly visible from the outside can be identified by interference fringe as shown in FIG. 13A to FIG. 13C and FIG. 14A to FIG. 14B. This means that a quantitative evaluation can be performed nondestructively on the generation of defective parts and on their degree of incidence.

The conditions for defective parts can be known based on the size, direction, frequency, and the like of interference fringe.

This type of quantitative evaluation that utilizes interference fringe can be in a manufacturing line for each electrostatic chuck individually. Therefore, the quality, reliability, and productivity of electrostatic chucks can be improved.

Next, further description will be given concerning the quantitative evaluation for defective parts using interference fringe.

First, the interference fringe is photographed using a laser microscope.

The following can be used as the laser microscope:
Scanning Type Confocal Laser Microscope (Olympus OLS-1100)
Laser Type Ar
Wavelength: 488 nm
Photographic Lens: ×50 Object Lens zoom 1
Optical Mode Non-Confocal
Laser Intensity: 100
Detection Sensitivity: 442
Off-Set: −16
Image: Brilliant Image
Photograph: 8 Accumulated Snapshots First, the dielectric substrate 3, or the dielectric substrate 3 provided on the electrostatic chuck 1, is mounted on the stage of the laser microscope. Then, the region to be measured (region to be photographed) is moved directly under the object lens. Next, the magnification of the object lens is selected and the like to determine the photograph field of view.

Photograph snapshots (8 accumulations) are taken in "non-confocal mode". If "confocal mode" is selected, setting the threshold value for extracting the interference fringe is difficult at the time of image process measurement due to the occurrence of uneven brightness. Even in "nonconfocal mode", sufficient resolution can be obtained.

Next, the image, photographed using the laser microscope, undergoes image processing (binary coded processing) measurement.

Figure 15:
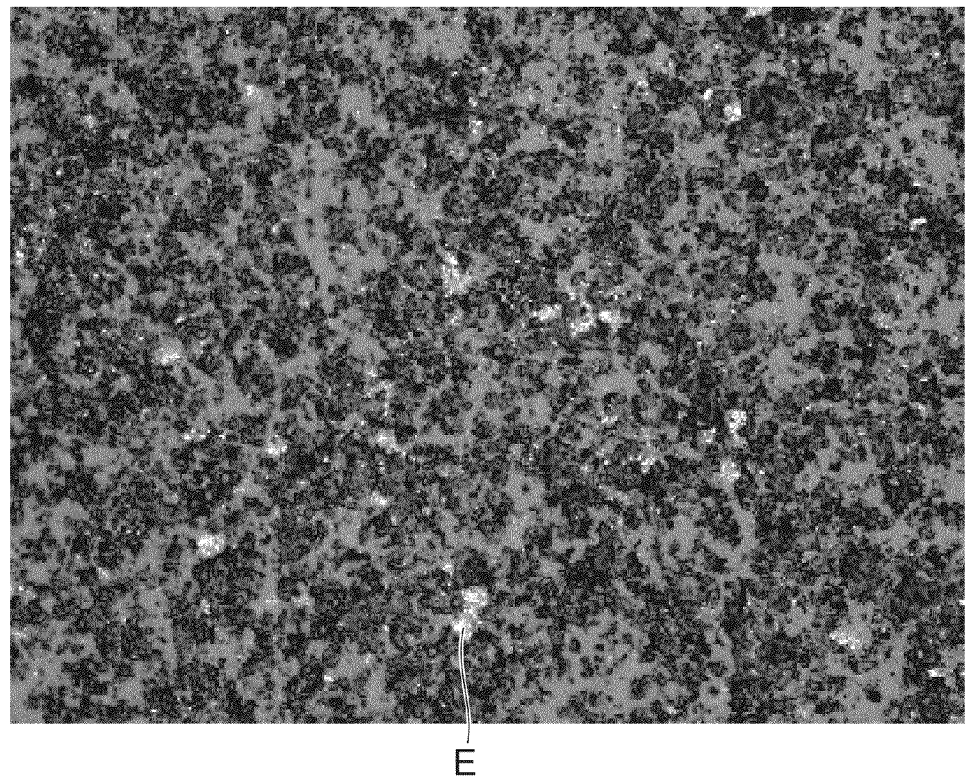
FIG. 15 is a photograph for illustrating the image that has been binary coded processed.

FIG. 15 is a photograph for illustrating the image that has been binary coded processed.

Note that the bright spot area E in the photograph is the area with interference fringe.

Image process measurement can be performed using the following image processing software:
Image Processing Software: Win-ROOF (Mitani Corp.)
Binary Coded Processing: 2800-4095
Image Processing Delete 0.2 μm>, Fill in
Measurement: Area Ratio Next, the quantitative evaluation is performed on the defect based on the image process measured results.

The quantitative evaluation on the defect can be performed based on the interference fringe space occupancy ratio (ratio of interference fringe portion area to image area). For example, in the case of FIG. 15, the interference fringe space occupancy ratio is approximately 0.97%.

According to the findings obtained by the inventors, if the interference fringe space occupancy ratio, found by using a laser microscope, on the major surface of the side where the adsorption target material is mounted is less than 1%, then the number of particles generated by desorption of a portion of the surface region can be greatly reduced.

In this case, defective parts residing in the surface region of the dielectric substrate 3 cannot be removed by buffing. Additionally, there is the risk of further increasing defective parts if using grinding processing methods, laser engraving methods, shot blasting methods, and the like.

Therefore, in the embodiment, in addition to forming the protrusion 3a, the flat part 3b2, the recess 13a, and the recess 13b, removal of defective parts that reside up to where the interference fringe space occupancy ratio is below 1% is also performed.

Figure 16:
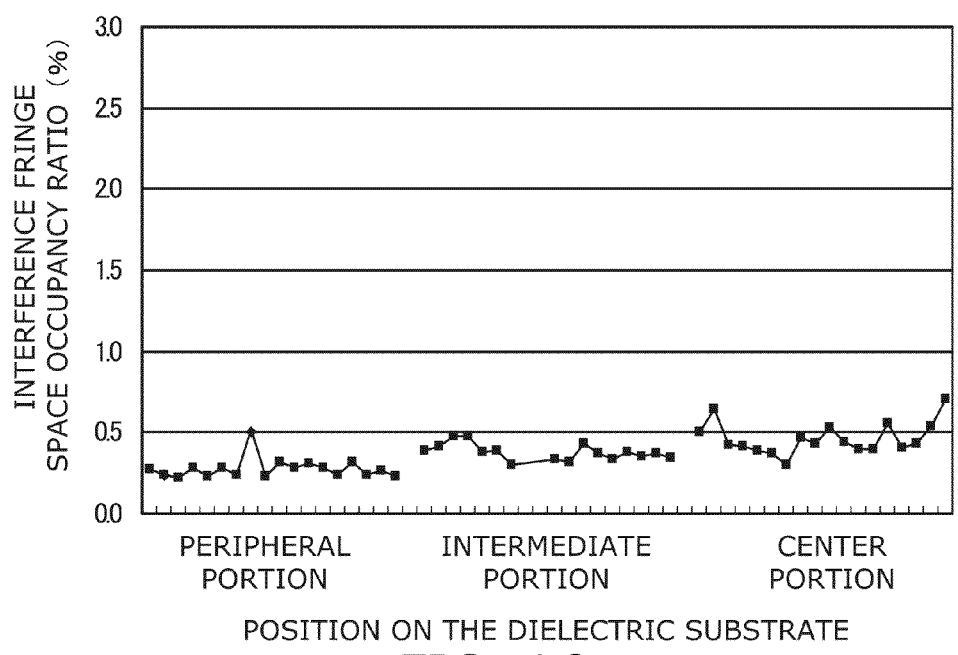
FIG. 16 is a graph for illustrating the conditions for removing defective parts using a CMP method.

FIG. 16 is a graph for illustrating the conditions for removing defective parts using a CMP method.

Figure 17:
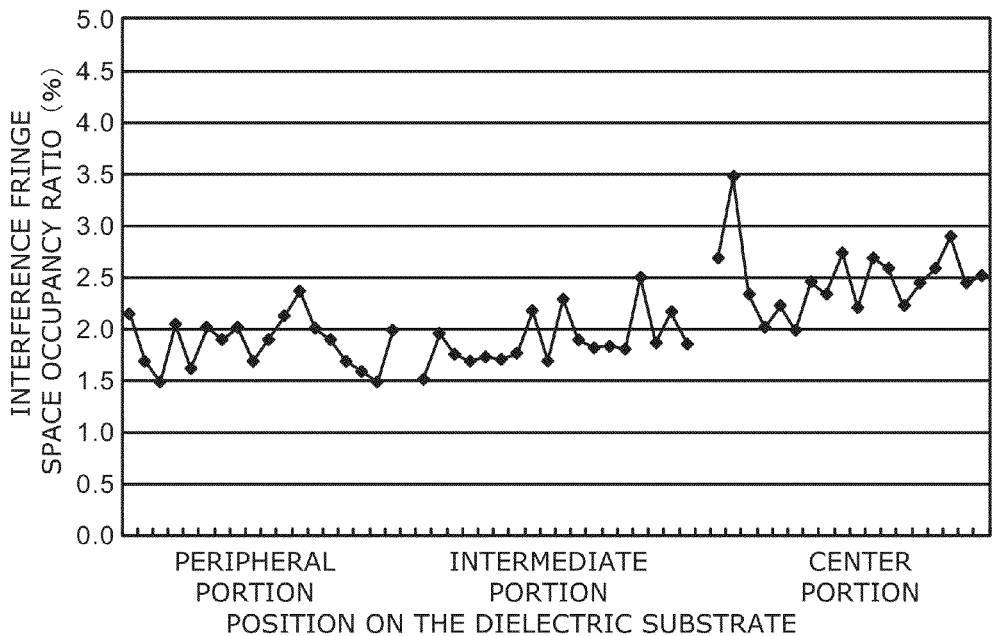
FIG. 17 is a graph for illustrating the conditions prior to removing defective parts using a CMP method.

FIG. 17 is a graph for illustrating the conditions prior to removing defective parts using a CMP method.

FIG. 16 and FIG. 17 show cases in which the dielectric substrate 3 is used in the electrostatic chuck that utilizes a Coulomb force.

An example of the dielectric substrate 3 used in the electrostatic chuck that utilizes a Coulomb force can be given as that which is formed from a polycrystalline ceramics sintered body, and has an alumina content of not less than 99.9 wt %, a bulk density of not less than 3.96, and a volume resistivity of not less than $10^{14}$ Ωcm in the operating temperature range of the electrostatic chuck.

In the specification, the bulk density is a value measured by the Archimedes method given in JIS standard (JIS R1634). In this case, the water saturation method can be a vacuum method, and distilled water can be used in the solvent.

As shown in FIG. 17, even if the interference fringe space occupancy ratio is approximately 3.5% at its maximum, using the CMP method according to the embodiment, the interference fringe space occupancy ratio can be made to be less than 1% as shown in FIG. 16.

Figure 18:
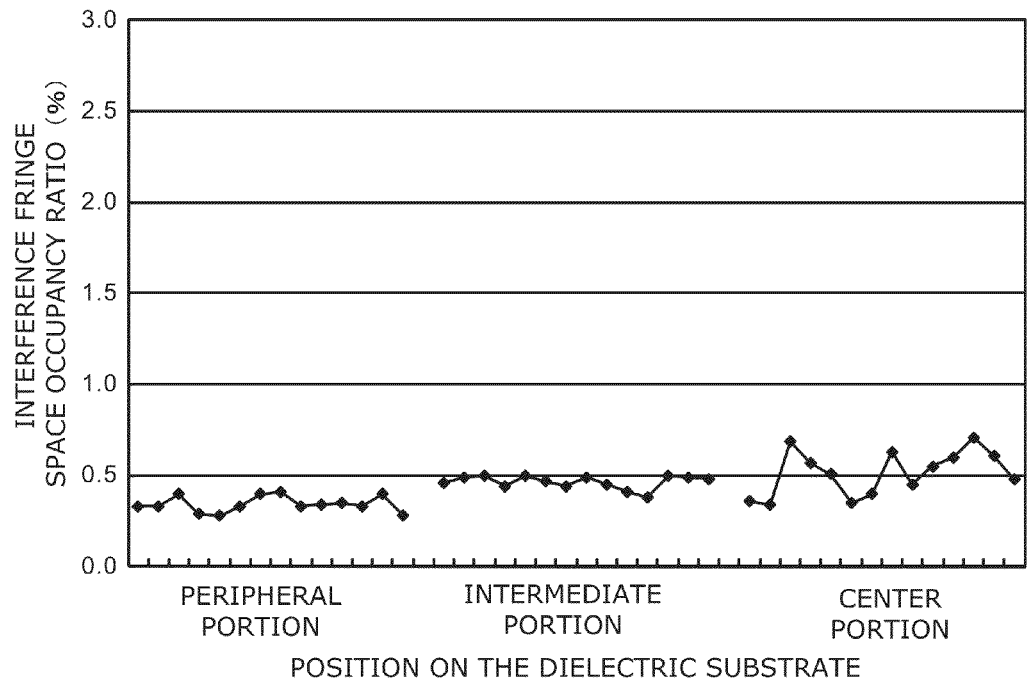
FIG. 18 is a graph for illustrating the conditions for removing defective parts using a CMP method.

FIG. 18 is a graph for illustrating the conditions for removing defective parts using a CMP method.

Figure 19:
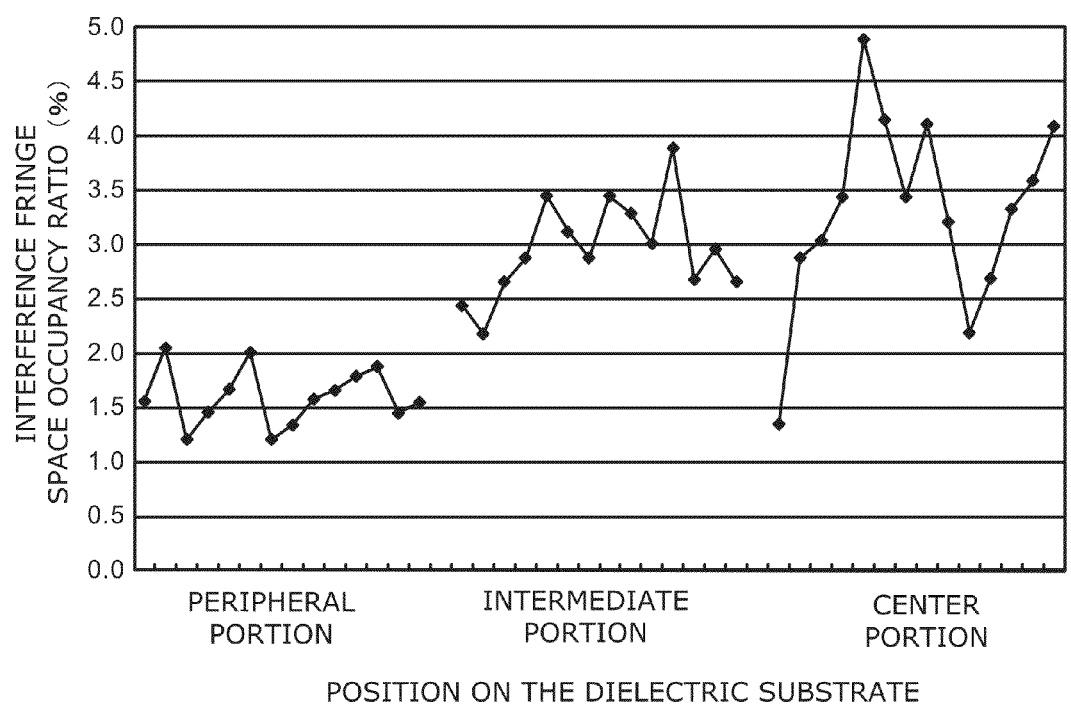
FIG. 19 is a graph for illustrating the conditions prior to removing defective parts using a CMP method.

FIG. 19 is a graph for illustrating the conditions prior to removing defective parts using a CMP method.

FIG. 18 and FIG. 19 show cases in which the dielectric substrate 3 is used in the electrostatic chuck that utilizes a Johnsen-Rahbeck force.

An example of the dielectric substrate 3 used in the electrostatic chuck that utilizes a Johnsen-Rahbeck force can be given as that which is formed from a polycrystalline ceramics sintered body, and has an alumina content of not less than 99.4 wt % and the volume resistivity of not less than $10^8$ Ωcm and not more than $10^{13}$ Ωcm in the operating temperature range of the electrostatic chuck.

As shown in FIG. 19, even if the interference fringe space occupancy ratio is approximately 5% at its maximum, using the CMP method according to the embodiment, the interference fringe space occupancy ratio can be made to be less than 1% as shown in FIG. 18.

In other words, even if the composition of the dielectric substrate 3 were to change, the interference fringe space occupancy ratio can be made to be less than 1% by using the CMP method as described above.

Here, the volume resistivity of the dielectric substrate 3 can be controlled at the time of firing.

Next, a description will be given of a manufacturing method for the dielectric substrate 3.

First, alumina and titanium oxide are prepared as raw materials. It is preferred that the alumina and titanium oxide used is that which particulates, and the alumina powder used is preferred to have an average grain diameter of not more than 0.3 μm and more preferably not more than 0.2 μm. Meanwhile, the titanium oxide powder used is preferred to have an average grain diameter of not more than 0.1 μm and more preferably not more than 0.05 μm. Distribution is improved when using fine granules as raw material making it more difficult for titanium compounds with a large grain diameter to segregate.

A preferred lower limit of the average grain diameter for alumina powder is 10 nm. Further, a preferred lower limit of the average grain diameter for titanium oxide powder is 5 nm.

Next, slurry adjustment, granulating, and raw processing are performed.

A predetermined amount of raw material is weighed and a dispersing agent, binder, and mold releasing agent are added and the mixture is crushed and stirred by a ball milling. It is preferred that ion exchanged water or the like is used on the mixture so that impurities are not introduced. After mixing, granulating is performed by a spray dryer and the obtained granulated powder is press molding so as to prepare a formed body. In addition, it is preferred that CIP molding be performed on the formed body. CIP molding raises the density of the formed body thereby raising the density of the fired object. Note that molding is not limited to dry molding and that the formed body can be obtained by utilizing molding methods such as extrusion molding, injection molding, sheet molding, slip casting, gel cast molding, and the like.

Next, firing is performed.

The formed body is fired under a nitrogen and hydrogen gas reduced atmosphere to manufacture the dielectric substrate 3.

Reduction firing is performed for titanium oxide to be a nonstoichiometry composition thereby enabling the volume resistivity to be controlled.

For example, by performing firing as given below, the dielectric substrate 3 that has the volume resistivity of not less than $10^8$ Ωcm and not more than $10^{13}$ Ωcm in the operating temperature range of the electrostatic chuck can be manufactured.

The firing temperature is preferred to be within the temperature range of 1150 to 1350° C. and more preferred to be between 1150 and 1200° C. Firing at a low temperature enables particle growth of the alumina particles while also suppressing the growth of segregated titanium compounds. Therefore, the maximum particle diameter of alumina particles can be made to be smaller. Further, the holding time at the maximum temperature for firing is preferably not less than two hours and more preferably not less than four hours in order to stabilize the physical properties of the fired object.

It is preferred that additional HIP processing is performed on the obtained sintered body. In this manner, a dense dielectric substrate 3 can be obtained.

The dielectric substrate 3 can be manufactured according to the description given above.

According to the quantitative evaluation method for defective parts according to the embodiment, an evaluation method that is nondestructive can be made on the generation of defective parts and on their degree of incidence. Based on this quantitative evaluation, the interference fringe space occupancy ratio can be made to be below the 1%. Moreover, this type of quantitative evaluation can be in a manufacturing line for each electrostatic chuck individually. Therefore, the number of particles generated by desorption of a portion of the surface region can be greatly reduced. Further, the quality, reliability, and productivity of electrostatic chucks can be improved.

An example was given for quantitatively evaluating defective parts such as cracks that reside within the surface region of the dielectric substrate 3, but quantitative evaluations can also be performed for defective parts such as cracks that reside in the surface region of the dielectric substrate according to other embodiments. For example, quantitative evaluations can also be performed for defective parts such as cracks that reside in the surface region of a dielectric substrate where a protrusion and a planar surface part are formed but the recess 13a and the recess 13b are not formed, a dielectric substrate with the plate-like shape where a protrusion and a planar surface part are not formed, and the like.

(Average Grain Diameter of Crystal Grains of Polycrystalline Ceramics Sintered Body)

Next, a description will be given concerning the average grain diameter of the crystal grains of the polycrystalline ceramics sintered body that configures the dielectric substrate 3.

First, a description will be given concerning the measurement of the average grain diameter of crystal grains.

The surface of the polycrystalline ceramics sintered body that is to be the measurement subject, is given a mirror finish without blemish. The mirror finish can be performed using a diamond wrap method. Moreover, the mirror finished surface undergoes thermal etching. The conditions for thermal etching and had a temperature of approximately 1330° C. for approximately 2 hours of time.

Next, a sputter coating of Au (gold) is applied to the surface. The thickness of the coating can be approximately 20 nm. A purpose for the Au (gold) sputter coating is to sharpen the contrast in the crystal grain boundary for when using a laser microscope. In other words, the Au (gold) sputter coating is applied to prevent laser light from penetrating into the polycrystalline ceramics sintered body. The Au (gold) sputter coating can be performed using an ion sputtering device (Hitachi, Ltd. E-105) or the like.

Next, the thermally etched polycrystalline ceramics sintered body is photographed using a laser microscope.

The polycrystalline ceramics sintered body is mounted on the stage of the laser microscope. Additionally, the region to be measured (region to be photographed) is moved directly under the object lens. Next, the magnification of the object lens is selected and the like to determine the photograph field of view.

Photograph snapshots (8 accumulations) are taken in "nonconfocal mode". If "confocal mode" is selected, setting the threshold value for extracting the crystal grain boundary is difficult at the time of image process measurement due to the occurrence of uneven brightness of the laser light. Even in "nonconfocal mode", sufficient resolution can be obtained.

Figure 20A:
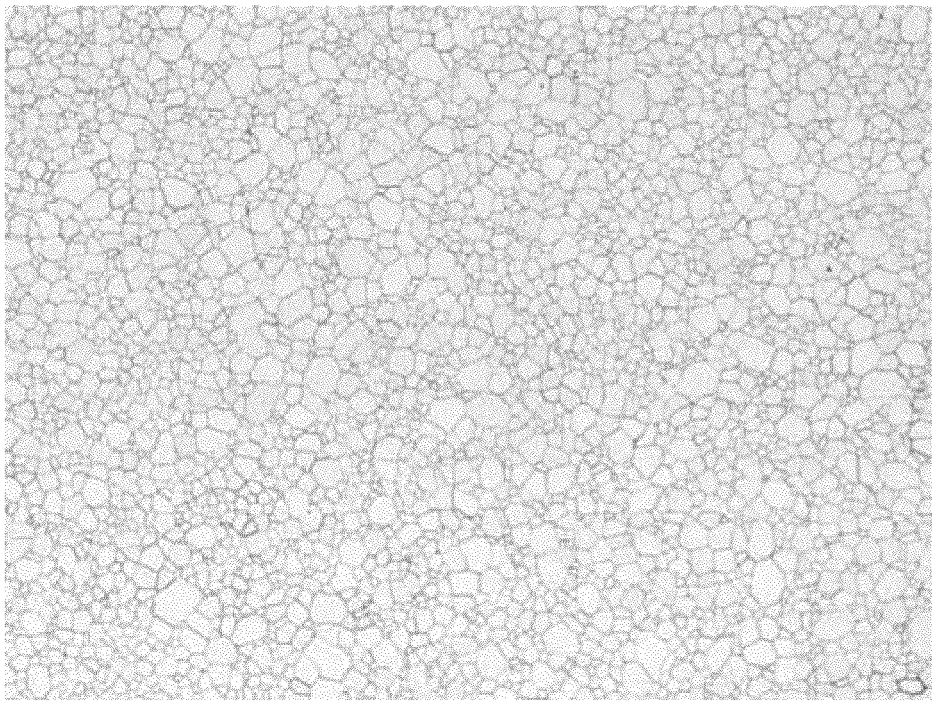
FIG. 20A shows the case where the average grain diameter of the crystal grains is approximately 1.8 μm.
Figure 20B:
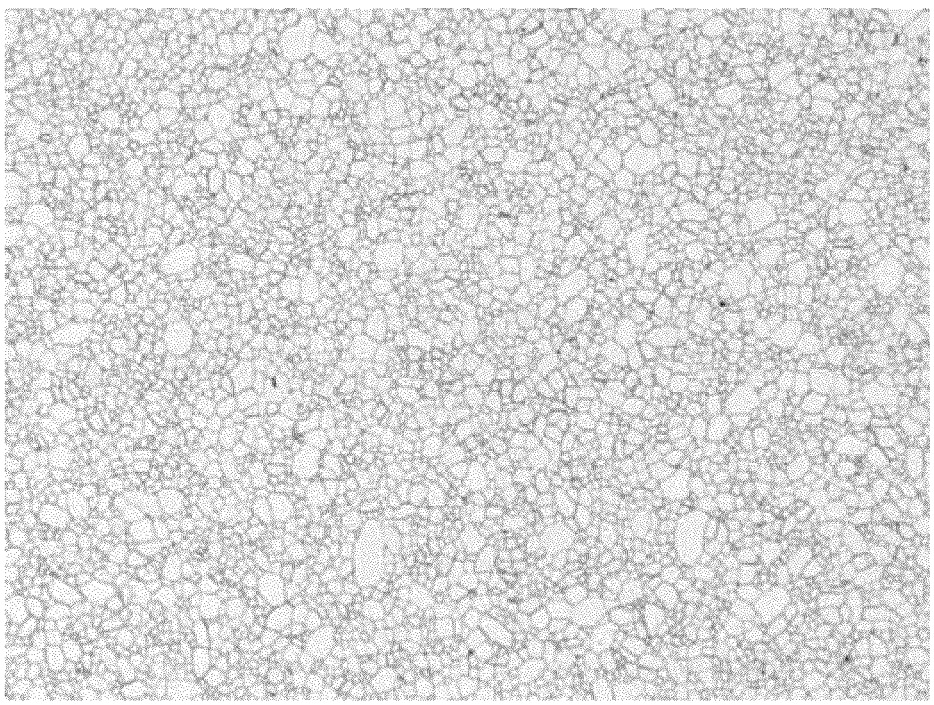
FIG. 20B shows the case where the average grain diameter of the crystal grains is approximately 1.4 μm.

The following can be used as the laser microscope:
Scanning Type Confocal Laser Microscope (Olympus OLS-1100)
Laser Type Ar
Wavelength: 488 nm
Photographic Lens: ×100 Object Lens zoom1
Optical Mode Non-Confocal
Laser Intensity: 100
Detection Sensitivity: 400
Off-Set: −30
Image: Brilliant Image
Photograph: 8 Accumulated Snapshots FIGS. 20A and 20B are photographs for illustrating the polycrystalline ceramics sintered body photographed by the laser microscope. FIGS. 20A and 20B show cases in which the dielectric substrate 3 is used in the electrostatic chuck that utilizes a Coulomb force. FIG. 20A shows the case where the average grain diameter of the crystal grains is approximately 1.8 µm, and FIG. 20B shows the case where the average grain diameter of the crystal grains is approximately 1.4 µm.

Figure 21:
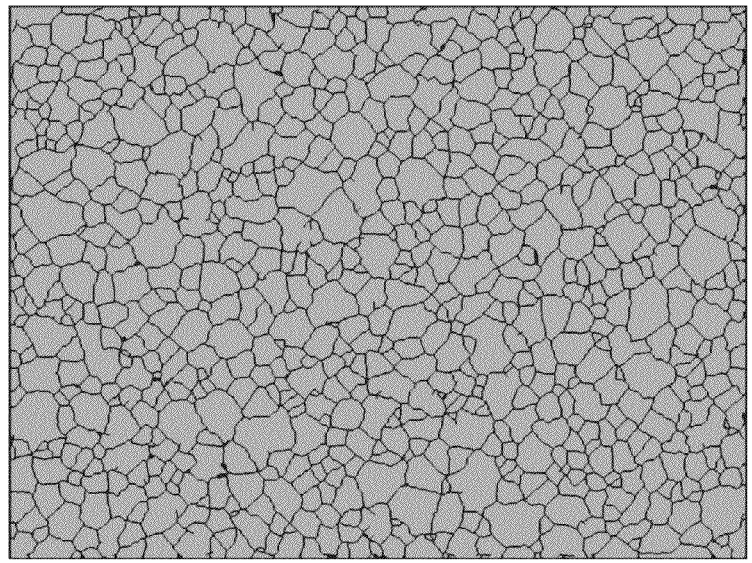
FIG. 21 is a photograph for illustrating the polycrystalline ceramics sintered body photographed by the laser microscope.

FIG. 21 is a photograph for illustrating the polycrystalline ceramics sintered body photographed by the laser microscope.

FIG. 21 shows the case where the dielectric substrate 3 is used in the electrostatic chuck that utilizes a Johnsen-Rahbeck force.

FIG. 21 shows the case where the average grain diameter of the crystal grains is approximately 1 µm.

Next, the average grain diameter of the crystal grains of the polycrystalline ceramics sintered body is found based on the image photographed using the laser microscope.

The calculation of the average grain diameter of the crystal grains can be performed using the software given below:
Image Processing Software: Win-ROOF (Mitani Corp.)
Calibration: 0.125 µm/pixels
Background Processing: 12.5 µm/100 pixels
Binary Coded Processing: 2100-2921
Circular Isolation: automatic processing
Measurement: circle equivalent diameter FIG. 22 is a graph for illustrating the average grain diameter of the crystal grains and the standard deviation grain diameter distribution.

Figure 23:
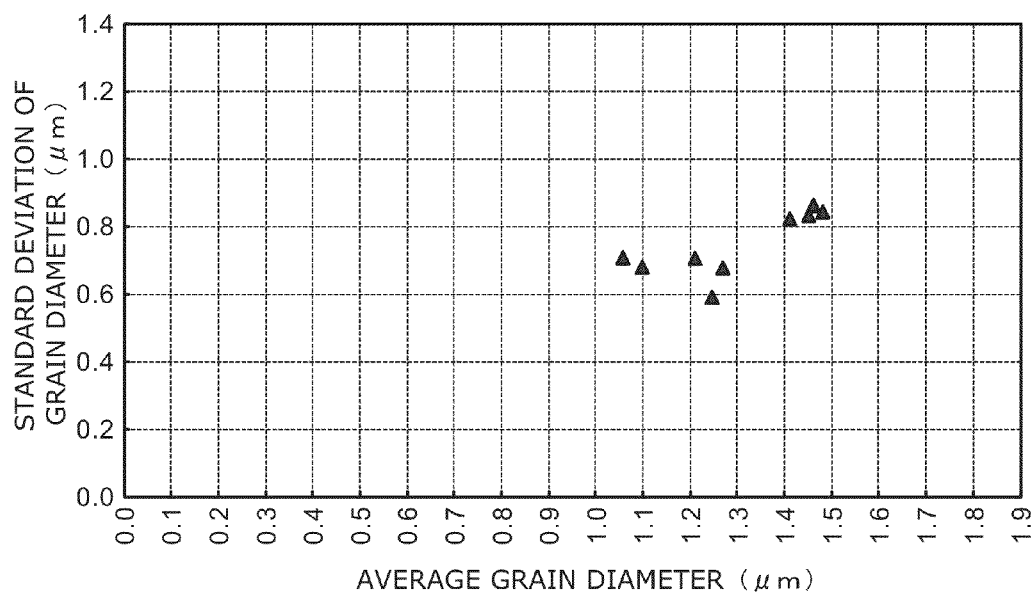
FIG. 23 is a graph for illustrating the average grain diameter of the crystal grains and the standard deviation grain diameter distribution.

FIG. 23 is a graph for illustrating the average grain diameter of the crystal grains and the standard deviation grain diameter distribution.

Figure 22:
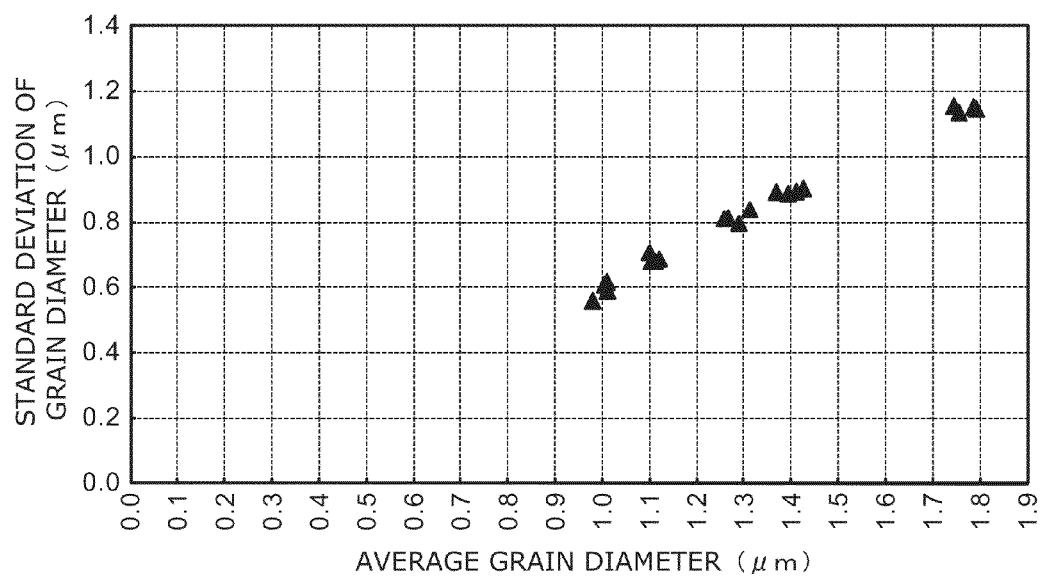
FIG. 22 is a graph for illustrating the average grain diameter of the crystal grains and the standard deviation grain diameter distribution.

FIG. 22 shows the case of the dielectric substrate 3 being used in the electrostatic chuck that utilizes the Coulomb force; and FIG. 23 shows the case of the dielectric substrate 3 being used in the electrostatic chuck that utilizes a Johnsen-Rahbeck force.

According to the findings obtained by the inventors, as long as the average grain diameter of the crystal grains is not less than 0.8 µm and not more than 1.5 µm, then shedding of crystal grains from the surface of the dielectric substrate 3 can be suppressed. As a result, the generation of particles can be suppressed. Even if shedding were to occur, they can be easily removed due to the small size of the grain diameter which makes it difficult to be held in the concave and convex parts. Changes in the shape of the protrusion 3a and the like due to shedding can be suppressed.

As long as the standard deviation of the grain diameter distribution is not more than 1 µm, the shedding of crystal grains from the surface of the dielectric substrate 3 can be further suppressed. The changing of the shape of the protrusion 3a can be suppressed even if crystal grains are shed. In this case, controlling the firing conditions enables control of the range of the average grain diameter of the crystal grains. For example, the growth of the crystal grains may be hindered by controlling the firing temperature (for example, approximately 1370° C.), the temperature profile, and the like.

(Depth Dimension of Micro Recesses)

Next, a description will be given concerning the measurement of micro recesses.

The following can be used as the laser microscope.
Scanning Type Confocal Laser Microscope (Olympus OLS-1100)

The following photographing conditions may be used accordingly.
Laser Type: Ar
Wavelength: 488 nm
Photographic Lens: ×100 Object Lens zoom 4.0
Optical Mode Confocal
Laser Intensity: 100
Detection Sensitivity: 400
Off-Set: 0

Image Uptake Mode: three-dimensional uptake (upper and lower limits)
Step Amount: 0.01 µm
Image: Brilliant Image
Photograph: 8 Accumulated Snapshots Photography may be performed according to the following procedure.

First, the dielectric substrate 3, or the dielectric substrate 3 provided on the electrostatic chuck 1, is mounted on the stage of the laser microscope.

The region to be measured (region to be photographed) is moved directly under the object lens.

Next, the magnification of the object lens is selected and the like to determine the photographic magnification.

The optical mode is set to confocal, and the uptake conditions in the height direction are set, and the image is photographed.

Figure 24A:
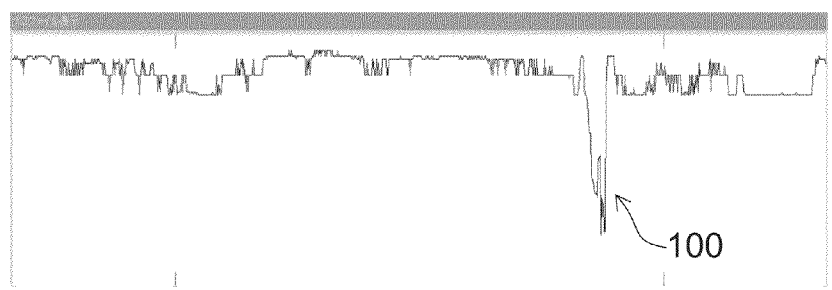
FIGS. 24A and 24B are diagrams for illustrating the dimension of the depth of the micro recess.
Figure 24B:
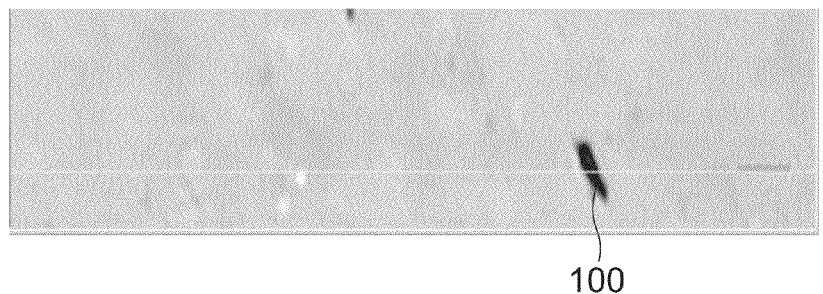

The measurement conditions for the depth of the micro recess may be according to as follows.
Measurement Mode: level difference measurement
Cross-Sectional Direction: horizontal and vertical
Average Mode: Line
Cross-Sectional Width: 1
Point: waveform position FIGS. 24A and 24B are diagrams for illustrating the measurement of the depth of the micro recess. Note that FIG. 24A is a graph for illustrating the profile of the measurement value; and FIG. 24B is a laser microscope photograph for illustrating the measurement position.

The measurement of the depth of the micro recess may be according to the following procedure.

First, measurement conditions are set in the photograph image.

As illustrated in the examples of FIGS. 24A and 24B, the profiles of the measurement values in the horizontal direction and the vertical direction can be scrolled, and not less than 12 points are measured for locations where there is large asperity within the image. However, defect 100 (formed by shedding) is omitted.

The largest level difference from among the level differences of the not less than 12 measured points is designated as the asperity MAX.

Here, the micro recess 13a formed in the top face 3a1 was found by the following procedure.

This is performed by a 3 equally distributed pitch (4 measurement images) toward the periphery from the center of the dielectric substrate 3 or the electrostatic chuck 1.

The maximum value from among the MAX value of the asperity level difference in each of the measured positions is taken as the depth dimension of the micro recess 13a formed in the top face 3a1.

Figure 25:
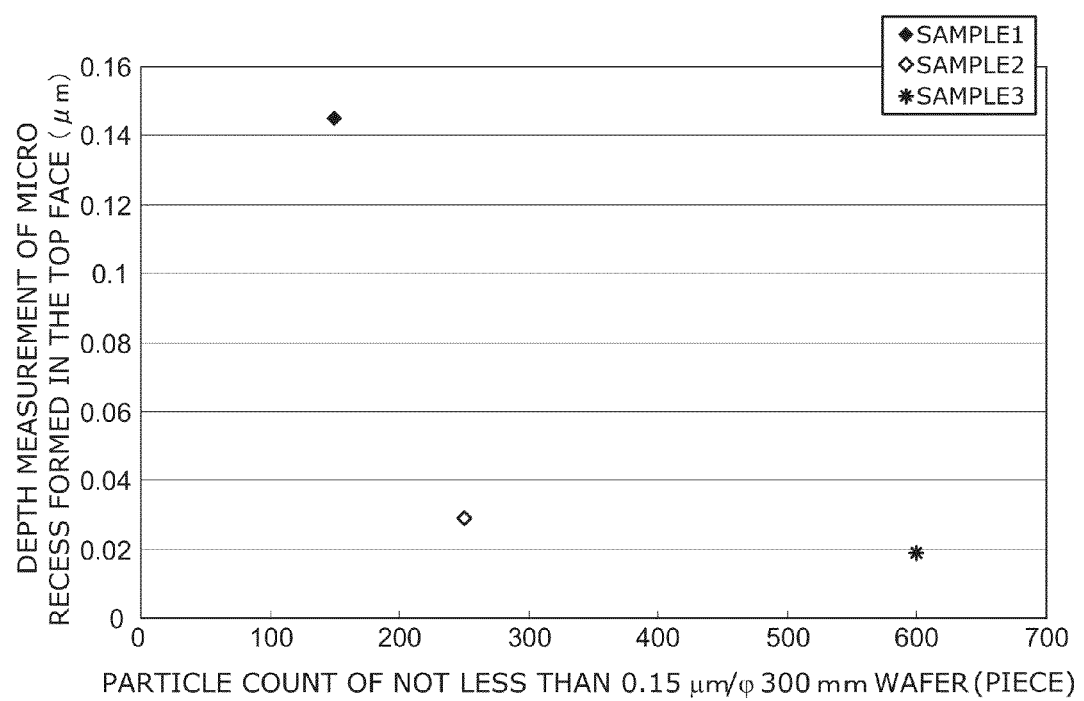
FIG. 25 is a graph illustrating the relationship between the depth dimension of the micro recess 13a formed in the top face 3a1 and the number of particles adhered to the underside of the adsorption target material.

FIG. 25 is a graph showing the relationship between the depth dimension of the micro recess 13a formed in the top face 3a1 and the number of particles adhered to the underside of the adsorption target material.

The depth dimension of the recess 13a in samples 1 to 3 was measured according to the photography conditions and measurement conditions described above.

The depth dimension of the recess 13a in sample 1 is approximately 150 nm; the depth dimension of the recess 13a in sample 2 is approximately 30 nm; and the depth dimension of the recess 13a in sample 3 is approximately 20 nm.

When the depth dimension of the recess 13a is approximately 20 nm, the number of particles that adhere to the underside of the adsorption target material was 600 pieces.

In contrast to this, if the depth dimension of the recess 13a is not less than 30 nm and not more than 150 nm, then the number of particles that adhere to the underside of the adsorption target material can be not more than 250 pieces. If the depth dimension of the recess 13a exceeds 150 nm, then removal of particles that have entered into the recess 13a becomes difficult.

Therefore, the depth dimension of the micro recess 13a is preferably not less than 30 nm and not more than 150 nm.
(Bulk Density and Alumina Content of Polycrystalline Alumina Sintered Body)

The bulk density and the purity (content) of the polycrystalline ceramics sintered body that is the base material are critical to forming the micro recesses 13a and 13b when using the CMP method described above.

A description will be given here of one example of a polycrystalline alumina sintered body.

Figure 26A:
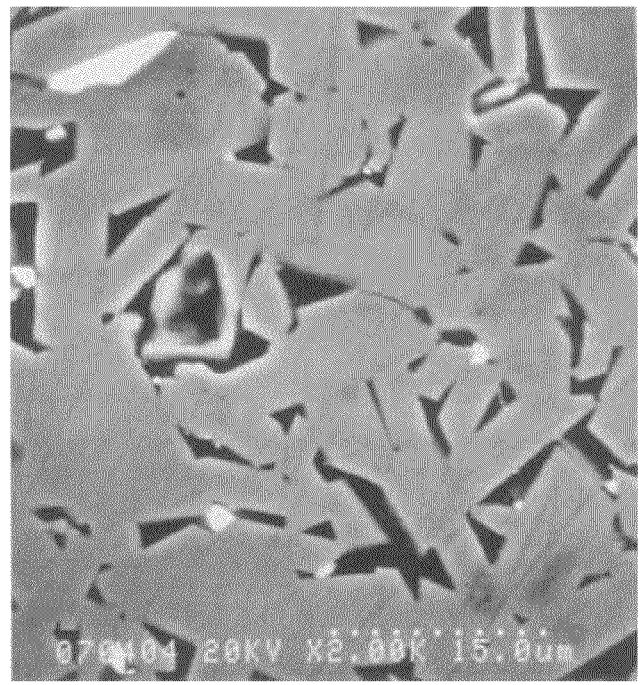
FIG. 26A shows the case where the average grain diameter of the crystal grains is between 20 μm and 50 μm, the bulk density is 3.7, and the alumina content is 90 wt %.
Figure 26B:
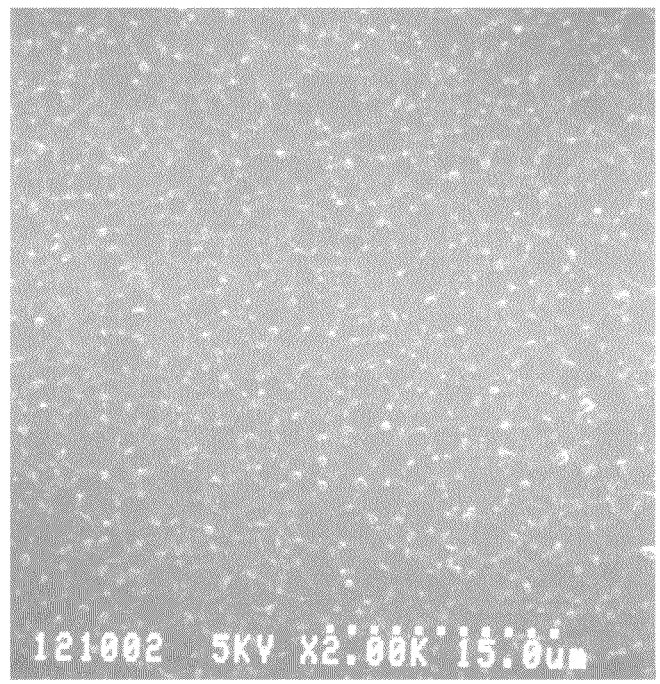
FIG. 26B shows the case where the average grain diameter of the crystal grains is not more than 1.5 μm, the bulk density is 3.96, and the alumina content is 99.9 wt %.

FIGS. 26A and 26B are scanning electron microscope photographs of the surface of the polycrystalline alumina sintered body. FIG. 26A shows the case where the average grain diameter of the crystal grains is between 20 µm and 50 µm, the bulk density is 3.7, and the alumina content is 90 wt %. FIG. 26B shows the case where the average grain diameter of the crystal grains is not more than 1.5 µm, the bulk density is 3.96, and the alumina content is 99.9 wt %.

As can be also seen from a comparison of FIGS. 26A and 26B, if the bulk density is not less than 3.96 and the alumina content is not less than 99.9 wt %, shedding of crystal grains from the dielectric substrate 3 can be more securely suppressed because the polycrystalline alumina sintered body that is the base material can have a dense configuration.

In this case, as long as the average grain diameter of the crystal grains is not less than 0.8 µm and not more than 1.5 µm, then there can be a dense configuration. There can be a dense configuration as long as at least one of the bulk density or purity (content) is within the predetermined range. However, it is preferred that both the bulk density and the purity (content) be within a predetermined range as described above. It is more preferred that the average grain diameter of the crystal grains be not less than 0.8 µm and not more than 1.5 µm. In this case, it is preferred that the standard deviation of the grain diameter distribution be not more than 1 µm as described above.

As long as the polycrystalline ceramics sintered body serving as the base material has a dense configuration, the micro recesses 13a and 13b can be uniformly and stably formed using the CMP method as described above. As a result, the generation of particles can be greatly reduced. In this case, the bulk density can be controlled by performing HIP processing (hot isostatic pressure) or the like. The average grain density of the crystal grains can be controlled by the firing conditions (firing temperature, firing profile, and the like) as described above.

Figure 27A:
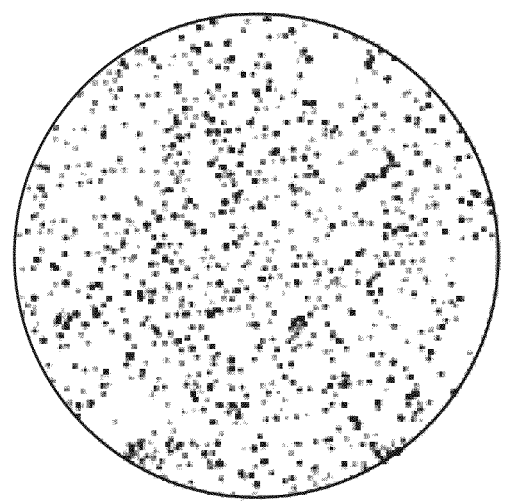
FIGS. 27A and 27B are schematic diagrams for illustrating the number of particles adhered to the underside of a semiconductor wafer. Note that FIG. 27A shows the case where the polycrystalline alumina sintered body serving as the base material is illustrated in FIG. 26A.
Figure 27B:
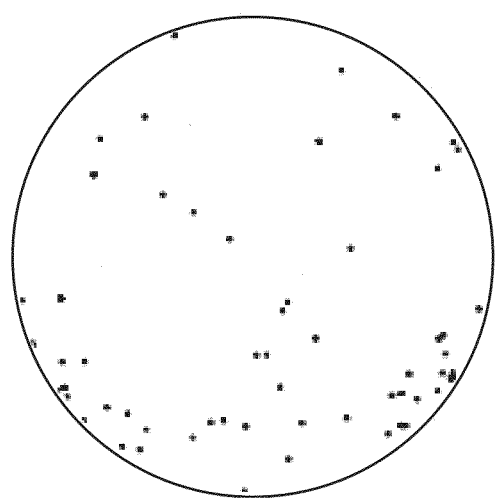

FIGS. 27A and 27B are schematic diagrams for illustrating the number of particles adhered to the underside of a semiconductor wafer. FIG. 27A shows the case of the polycrystalline alumina sintered body serving as the base material shown in FIG. 26A; and FIG. 27B shows the case of the polycrystalline alumina sintered body serving as the base material shown in FIG. 26B.

In the case of FIG. 27A, the number of particles adhered to the underside of an 8 inch semiconductor wafer is 1058 pieces;

and in the case of FIG. 27B, the number of particles adhered to the underside of an 8 inch semiconductor wafer is 67 pieces.
(Other Embodiments of the Electrostatic Chuck)

FIGS. 28A and 28B are schematic cross-sectional views for illustrating the electrostatic chuck 1a according to another embodiment. FIG. 28A shows a schematic cross-sectional view for illustrating the electrostatic chuck, and FIG. 28B shows a schematic magnified view of the F part in FIG. 28A.

In the electrostatic chuck 1a according to the embodiment, the electrode 4 is embedded in the dielectric substrate 30.

This type of electrostatic chuck 1a can be manufactured using, for example, a green sheet print lamination method and the like.

For example, an electrode may be formed by, first, screen-printing a tungsten paste on a green sheet made of polycrystalline ceramics sintered body (for example, a polycrystalline alumina sintered body). Afterwards, to embed the electrode, a plurality of green sheets is pressure laminated to form a stacked body prior to firing. The stacked body is cut and processed to a desired shape and fired in a reduced atmosphere to enable manufacture of the dielectric substrate 30 with an electrode embedded therein.

(Method of Manufacturing Electrostatic Chuck)

Next, an illustration will be given of a manufacturing method of the electrostatic chuck according to the embodiment.

The dielectric substrate 3 provided on the electrostatic chuck can be manufactured according to the description given above. Because known technology can be applied to the processes relating to the formation, bonding, take up, and the like of each essential element for the electrode 4 and the like, explanations of these are omitted and descriptions of only unique processes are given.

FIG. 29 is a flowchart for illustrating the manufacturing method of the electrostatic chuck according to the embodiment.

First, using a known sand blasting method, the approximate shape of the protrusion 3a and the planar surface part 3b are formed in a major surface of the side where the adsorption target material of the dielectric substrate 3 is mounted.

Next, as shown in FIG. 29, the protrusion 3a, the flat part 3b2, the recess 13a, and the recess 13b are formed using the CMP method described above.

At this time, the defect occupancy percentage is found using the quantitative evaluation method for defective parts described above, and CMP processing continues until the defect occupancy percentage reaches not less than a predetermined value.

In other words, the process continues on the major surface until the interference fringe space occupancy ratio on the major surface found by using the laser microscope is less than 1%.

Note that detailed descriptions are omitted because the details that relate to the CMP method and the quantitative evaluation method for defective parts can be similar to those described above.

INDUSTRIAL APPLICABILITY

As described above, according to the invention, an electrostatic chuck that can suppress the generation of particles and that can easily recover a clean state of the electrostatic chuck surface can be provided and has significant advantages to industry.

REFERENCE SIGNS LIST 1 electrostatic chuck
1a electrostatic chuck
2 base
3 dielectric substrate
3a protrusion
3a1 top face
3b planar surface part
3b1 hole
3b2 flat part
3c space
4 electrode
10a power source
10b power source
13a recess
13b recess
30 dielectric substrate

The invention claimed is:

1. An electrostatic chuck, comprising a dielectric substrate having a protrusion and a planar surface, the protrusion being formed on a major surface of the dielectric substrate, an adsorption target material being mounted on the major surface, the planar surface part being formed in a periphery of the protrusion,
the dielectric substrate being formed from a polycrystalline ceramics sintered body, and
the major surface having been processed by CMP method until an interference fringe space occupancy ratio on the major surface found by using a laser microscope becomes less than 1%.

2. The electrostatic chuck according to claim 1, wherein an average grain diameter of crystal grains of the polycrystalline ceramics sintered body is less than a height dimension of the protrusion.

3. The electrostatic chuck according to claim 2, wherein the average grain diameter is not more than 1.5 μm.

4. The electrostatic chuck according to claim 2, a standard deviation of a distribution of the grain diameter of the crystal grains is not more than 1 μm.

5. The electrostatic chuck according to claim 1, wherein the dielectric substrate is formed from a polycrystalline alumina sintered body and has a bulk density of not less than 3.96.

6. The electrostatic chuck according to claim 1, wherein the dielectric substrate is formed from a polycrystalline alumina sintered body and has an alumina content of not less than 99.9 wt %.

7. The electrostatic chuck according to claim 1, wherein the dielectric substrate has a volume resistivity of not less than $10^8$ Ω cm and not more than $10^{13}$ Ω cm in an operating temperature range of the electrostatic chuck.

8. The electrostatic chuck according to claim 7, wherein the dielectric substrate is formed from a polycrystalline alumina sintered body and has an alumina content of not less than 99.4 wt %.

9. A method for manufacturing an electrostatic chuck including a dielectric substrate having a protrusion and a planar surface part, the protrusion being formed on a major surface of the dielectric substrate, an adsorption target material being mounted on the major surface, the planar surface part being formed in a periphery of the protrusion, the method comprising:
forming the dielectric substrate from a polycrystalline ceramics sintered body; and
continuing performing CMP method to the major surface until the interference fringe space occupancy ratio on the major surface found by using a laser microscope is less than 1%.

* * * * *